US012410202B2

(12) United States Patent
Li et al.

(10) Patent No.: US 12,410,202 B2
(45) Date of Patent: Sep. 9, 2025

(54) GROUP V AND VI TRANSITION METAL PRECURSORS FOR THIN FILM DEPOSITION

(71) Applicant: VERSUM MATERIALS US, LLC, Tempe, AZ (US)

(72) Inventors: Guocan Li, Tempe, AZ (US); Sergei V. Ivanov, Tempe, AZ (US); Xinjian Lei, Tempe, AZ (US); Hongbo Li, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 844 days.

(21) Appl. No.: 17/616,470

(22) PCT Filed: May 28, 2020

(86) PCT No.: PCT/US2020/034908
§ 371 (c)(1),
(2) Date: Dec. 3, 2021

(87) PCT Pub. No.: WO2020/247237
PCT Pub. Date: Dec. 10, 2020

(65) Prior Publication Data
US 2022/0315612 A1     Oct. 6, 2022

Related U.S. Application Data

(60) Provisional application No. 62/857,650, filed on Jun. 5, 2019.

(51) Int. Cl.
C07F 9/00 (2006.01)
C01B 21/06 (2006.01)
(Continued)

(52) U.S. Cl.
CPC .......... *C07F 9/005* (2013.01); *C01B 21/0617* (2013.01); *C23C 16/34* (2013.01); *C23C 16/45536* (2013.01); *C23C 16/45553* (2013.01)

(58) Field of Classification Search
None
See application file for complete search history.

(56) References Cited

U.S. PATENT DOCUMENTS 2,930,807 A * 3/1960 Case .................... B01J 31/1805
502/118
3,144,472 A * 8/1964 Werner ................... C03C 17/09
504/192
(Continued)

FOREIGN PATENT DOCUMENTS

CN     101528759 A     9/2009
EP     1146141 A2     10/2001
(Continued)

OTHER PUBLICATIONS

Laurent, Francois, et al. "New Organometallic Route to Vanadium Carbonitride Thin Films," J. Mater Chem., 1993, 3 (6), 659-663.
(Continued)

*Primary Examiner* — John J Figueroa
(74) *Attorney, Agent, or Firm* — William T. Slaven, IV; Versum Materials US, LLC

(57) ABSTRACT

Described herein are Group V and VI compounds used as precursors for depositing Group V and VI-containing films. Ligands with alkyl, amide, imide, amidinate groups and/or cyclopentadienyl (Cp) ligands are used to form Group V and VI complexes used as precursors. Examples of Group V and VI precursor compounds include, but are not limited to, Cp amide imide alkyl vanadium compounds, Cp amide imide alkylamide vanadium compounds, Cp amide imide alkoxide vanadium compounds, Cp amide imide amidinate vanadium compounds, and alkylimide vanadium trichloride com-
(Continued)

pounds. The Group V and VI precursors are used for deposition on substrate surfaces with superior film properties such as uniformity, continuity, and low resistance. Examples of substrate surfaces for deposition of metal-containing films include, but are not limited to metals, metal oxides, and metal nitrides.

53 Claims, 16 Drawing Sheets

(51) Int. Cl.
*C23C 16/34* (2006.01)
*C23C 16/455* (2006.01)

(56) References Cited

U.S. PATENT DOCUMENTS

| | | | | |
|---|---|---|---|---|
| 3,290,342 | A * | 12/1966 | Stern, Jr. | C07F 9/02 |
| | | | | 987/301 |
| 3,394,156 | A * | 7/1968 | Kornicker | C08F 4/06 |
| | | | | 526/341 |
| 3,455,974 | A * | 7/1969 | Su | C07F 9/005 |
| | | | | 502/103 |
| 6,475,902 | B1 | 11/2002 | Hausmann et al. | |
| 6,503,561 | B1 | 1/2003 | Senzaki et al. | |
| 2007/0154637 | A1* | 7/2007 | Shenai-Khatkhate | |
| | | | | C30B 25/02 |
| | | | | 427/248.1 |
| 2010/0055310 | A1 | 3/2010 | Merle et al. | |
| 2016/0307905 | A1* | 10/2016 | Lansalot-Matras | |
| | | | | C23C 16/45553 |
| 2018/0355484 | A1 | 12/2018 | Lansalot-Matras et al. | |
| 2019/0202847 | A1 | 7/2019 | Han et al. | |

FOREIGN PATENT DOCUMENTS

| | | |
|---|---|---|
| EP | 1916253 A1 | 4/2008 |
| WO | 2006093261 A | 9/2006 |
| WO | 2018048124 | 3/2018 |
| WO | 2018048124 A1 | 3/2018 |

OTHER PUBLICATIONS

Le Ny, Jean Pierre, et al. "Synthesis and Study of Imldoalkyl Complexes of Tungsten(VI): Application of 14N NMR Spectroscopy," Organometallics 1991, 10, 1546-1550.
Radius, Udo, et al. "Bis(cyclopentadienyl) Diimido Complexes of Molybdenum and Tungsten [CP2M(NR)2] at the Limit of Pi-Bond Saturation," Eur. J. Inorg. Chem. 2001, 1617-1623.
Sreenivasan, Raghavasimhan, et al. "High temperature phase transformation of tantalum nitride films deposited by plasma enhanced atomic layer deposition for gate electrode applications," Applied Physics Letters, 90, 102101 (2007).
Laurent, F., et al. "New Organometallic Route to Vanadium Carbonitride Thin Films," Journal of Mater. Chem., 1993, vol. 3, No. 6, pp. 659-663.
Preuss, Fritz, et al. "tert-Butylimino-cyclopentadienyl-alkylvanadium(V)-Verbindungen Darstellung und NMR-spektroskopische Untersuchungen," Zeitschrift für Naturforschung 1990, 45, 191-198.
Humphries, Martin J., et al., "Niobium n-Cyclopentadienyl Compounds with Imido and Amido Ligands Derived from Tert-Butylamine," J. Chem. Soc. Dalton Trans. 2000, 22, 4044-4051.
Priebsch, Wolfgang, et al., "Preparation and 51V NMR Characteristics of Oxovanadium(V) Compounds. Relation between Metal Shielding and Ligand Electronegativity," Inorg. Chem. 1985, 24, 3058-3062.
Gauntt, Bryan Douglas. "The Nano-Composit Nature of Vanadium Oxide Thin Films for Use In Infrared Microbolometers". Pennsylvania State University Graduate School, Dept. of Materials Science and Engineering; A Dissertation. (c) Bryan Douglas Gauntt, May 2011.

* cited by examiner

GROUP V AND VI TRANSITION METAL PRECURSORS FOR THIN FILM DEPOSITION

CROSS REFERENCE TO RELATED PATENT APPLICATIONS

This application is a National Stage filing under 35 U.S.C. 371 of International Patent Application No. PCT/US2020/034908, filed May 28, 2020, claims the benefit of U.S. application Ser. No. 62/857,650 filed on Jun. 5, 2019. Both applications are hereby incorporated by reference.

BACKGROUND OF THE INVENTION

Described herein are organometallic compounds comprising Group V and VI transition metals, compositions containing the compounds and methods of using the compounds as precursors in the deposition of metal-containing films.

Transition metal-containing films are used in semiconductor and electronics applications. Chemical Vapor Deposition (CVD) and Atomic Layer Deposition (ALD) have been applied as the main deposition techniques for producing thin films for semiconductor devices. These methods enable the achievement of conformal films (metal, metal oxide, metal nitride, metal silicide, and the like) through chemical reactions of metal-containing compounds (precursors). The chemical reactions occur on surfaces which may include metals, metal oxides, metal nitrides, metal silicides, and other surfaces. In CVD and ALD, the precursor molecule plays a critical role in achieving high quality films with high conformality and low impurities. The temperature of the substrate in CVD and ALD processes is an important consideration in selecting a precursor molecule. Higher substrate temperatures, in the range of 150 to 500 degrees Celsius, promote a higher film growth rate. The preferred precursor molecules must be stable in this temperature range. The preferred precursor is capable of being delivered to the reaction vessel in a liquid phase. Liquid phase precursors provide a more uniform delivery of precursor to the reaction vessel than solid phase precursors.

Cyclopentadienyl (Cp) bridged organometallic compounds containing Group IV metal compounds, such as zirconium, have been used as precursors for CVD and/or ALD of Group IV-metal containing films. Films containing Group V and VI transition metals, particularly vanadium, niobium, and tantalum, molybdenum, and tungsten are also important for a variety of semiconductor or electronics applications. Organometallic compounds containing Group V and Group VI transition metals in Cp amide imide compounds and alkylimide trichloride compounds and methods of their synthesis are generally known in the art.

For example, Bouwkamp, et al. in *Organometallics* 27, 4071-4082 (2008) disclose a Cp amide tert-butylimide methyl vanadium compound; the reaction of cationic linked Cp-amido complexes and related half-sandwich complex [CpV(N-p-Tol)(N-i-Pr$_2$)(BrC$_6$D$_5$)][MeB(C$_6$F$_5$)$_3$] with alkynes, which gives evidence for both insertion and [2+2] cycloaddition chemistry.

Witte, Peter T. et al Journal of the American Chemical Society 119(43), 10561-10562, (1997) report the generation and NMR-spectroscopic characterization of adducts of simple olefins (ethene, propene) with a cationic d$^0$ vanadium (V) metal center, $\{[\eta^5, \eta^1$—C$_5$H$_4$—(CH$_2$)$_2$Ni—Pr]V(Nt-Bu) (η-olefin)\}+, as well as quantum chemical calculations on these new species.

Laurent, F., et al. Journal of Materials Chemistry 3(6): 659-663 (1993) disclose chloroimidovanadium compounds Cl$_3$VNR [R=Me, C$_6$H$_4$Me, CMe$^3$] studied by thermal analysis and evaluated as molecular precursors to vanadium nitride by chemical vapour deposition (CVD). The decomposition mechanism of and is complex and depends on the nature of the carrier gas, but in both cases the temperature at which decomposition ends (900° C.) is too high for their practical use in low-temperature CVD processes. Compound is volatile and decomposes at quite low temperatures (<250° C.), and has been used as a precursor to vanadium nitride in a hot-wall CVD reactor. Shiny, black metal-like thin films have been obtained that have been characterized as vanadium carbonitride by X-ray powder patterns and XPS analysis.

Batinas, A. A., et al. "*Organometallics* 29(23): 6230-6236 (2010) teach the thermolysis of half-sandwich V imido complexes, Cp(RN)V(i-Pr$_2$N)Me (R=p-Tol, 1a; R=t-Bu, 1b), results in a mixture of products, including V(IV) dimers [CpVMe]$_2$(p-RN)$_2$, i-Pr$_2$NH, i-PrNCMe$_2$, CH$_4$, and one or more paramagnetic species. In the presence of dmpe (dmpe=bis(dimethylphosphino)ethane), PMe$_3$, or PhSSPh, the initially formed paramagnetic species can be trapped, providing Cp(RN)VL$_2$ (R=p-Tol, L$_2$=dmpe, 2a; R=t-Bu, L2=dmpe, 2b; R=p-Tol, L=PMe$_3$, 3a; R=t-Bu, L=PMe$_3$, 3b; R=t-Bu, L=SPh, 4b). Probably the initially formed species is [Cp(RN)V]. When generated in situ, [Cp(RN)V] is active in the [2+2+2] cyclotrimerization of PhC≡CH (R=p-Tol, t-Bu) and PhC≡CPh (R=t-Bu). Also, the data presented indicate a mechanism in which both [CpVMe]2(µ-RN)$_2$ and [Cp(RN) V] originate from a common intermediate, V(IV) imido species [Cp(RN)VMe].

WO2019156400 A1 discloses an organometallic compound and a thin film using same having high volatility, excellent chemical and thermal stability, and a remarkably improved thin film deposition rate even at low temperatures. In addition, it is possible to realize a thin film having improved property degradation due to a by-product, excellent step coverage, and high permittivity so as to have an electrically equivalent oxide thickness (EOT) and a thickness such that tunneling, in physics, does not occur.

WO2012005957 A2 teaches a method of forming a dielectric material, comprising doping a zirconium oxide material, using a dopant precursor selected from the group consisting of Ti(NMe$_2$)$_4$; Ti(NMeEt)$_4$; Ti(NEt$_2$)$_4$; TiCl$_4$; tBuN:Nb(NEt$_2$)$_3$; tBuN:Nb(NMe$_2$)$_3$; t-BuN:Nb(NEtMe)$_3$; t-AmN:Nb(NEt$_2$)$_3$; t-AmN:Nb(NEtMe)$_3$; t-AmN:Nb(NMe$_2$)$_3$; t-AmN:Nb(OBu-t)$_3$; Nb-13; Nb(NEt$_2$)$_4$; Nb(NEt$_2$)$_5$; Nb(N(CH$_3$)$_2$)$_5$; Nb(OC2H$_5$)$_5$; Nb(thd)(OPr-i)$_4$; SiH(OMe)$_3$; SiCU; Si(NMe$_2$)$_4$; (Me$_3$Si)$_2$NH; GeR$^a$x(OR$^b$)$_{4-x}$ wherein x is from 0 to 4, each R$^a$ is independently selected from H or C$_1$-C$_8$ alkyl and each R$^b$ is independently selected from C$_1$-C$_8$ alkyl; GeCl$_4$; Ge(NR$^a_2$)$_4$ wherein each R$^a$ is independently selected from H and C$_1$-C$_8$ alkyl; and (R$^b_3$Ge)$_2$NH wherein each R$^b$ is independently selected from C$_1$-C$_8$ alkyl; bis(N,N'-diisopropyl-1,3-propanediamide) titanium; and tetrakis(isopropylmethylamido) titanium; wherein Me is Me, Et is Et, Pr-i is iso-Pr, t-Bu is tert-Bu, t-Am is tertiary amyl, and thd is 2,2,6,6-tetramethyl-3,5-heptanedionate. Doped zirconium oxide materials of the present disclosure are usefully employed in ferroelectric capacitors and dynamic random access memory (DRAM) devices.

There is a need in the art for thermally stable Group V and Group VI organometallic compounds suitable as CVD and ALD precursors that can be delivered in liquid phase, have low impurities, and can produce a high-quality film with high conformality.

SUMMARY

Described herein are Group V and VI compounds or complexes suitable as CVD and ALD precursors, (as used herein, the terms compounds and complexes are interchangeable). Also described are compositions comprising Group V and VI metal-film precursors used for depositing Group V and VI metal-containing films; the Group V and VI metal containing films themselves, and methods for depositing the metal containing films deposited using the precursors. The precursors and compositions are thermally stable, have low impurities, are suitable for liquid delivery and yield high quality films with high conformality.

Examples of Group V and VI precursor compounds described herein include, but are not limited to, Group V and VI Cp amide imide compounds and Group V and VI alkylimide trichloride compounds. Examples of Group V and VI-containing films include, but are not limited to, Group V and VI oxide films, and Group V and VI nitride films. Examples of surfaces for deposition of metal-containing films include, but are not limited to, metals, metal oxides, metal nitrides, silicon, silicon oxide and silicon nitride. Methods for depositing the Group V and VI-containing films include CVD, ALD and ALD-like processes.

The present invention discloses organometallic precursors suitable as CVD and ALD precursors for depositing Group V and VI transition metal-containing films, having the structural formulae (or structures) A through G:

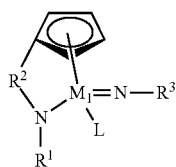

A

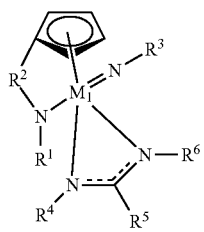

B

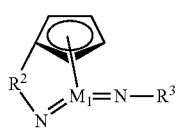

C

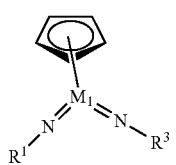

D

E

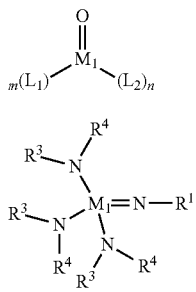

F

G

Wherein:
$M_1$ is V, Ta, Nb, Cr, Mo or W;
X is a halide selected from chloride (Cl), bromide (Br) and iodide (I);
$R^1$ is a linear or branched $C_1$-$C_{10}$ alkyl, an amino group or an ether group for structures A and B; and is a linear or branched $C_1$-$C_{10}$ alkyl, an amino group or an ether group but not tert-butyl for structures C and G;
$R^2$ is a linear or branched $C_2$-$C_{10}$ alkylene;
$R^{3-4}$ and $R^6$ are independently selected from a linear or branched $C_1$-$C_{10}$ alkyl, an amino group or an ether group;
$R^5$ is hydrogen or a linear or branched $C_1$-$C_{10}$ alkyl,
L is $R^1$, $OR^1$ or $NR^1R^3$;
$L_1$ is a Cp or substituted Cp;
$L_2$ is $NR^1R^3$;
m has a value of 0, 1, 2; and
n has a value of 1, 2, 3 or 4.

In another aspect, there is provided a composition comprising: (a) an organometallic precursors having the structures A to G; and (b) at least one solvent. Preferred solvents include, without limitation, ether, tertiary amine, alkyl hydrocarbon, aromatic hydrocarbon, siloxanes, tertiary aminoether, and combinations thereof. In an embodiment, the difference between the boiling point of the precursor and the boiling point of the solvent is 40 degrees Celsius or less, less than about 30 degrees Celsius and in some cases less than about 20 degrees Celsius, preferably less than 10 degrees Celsius. As used herein, the term "about" means within 5 percent.

In another aspect, there is provided a method for forming a Group IV or Group V transition metal-containing film on at least one surface of a substrate comprising:
providing the at least one surface of the substrate in a reaction chamber; and
forming the transition metal-containing film on the at least one surface by a deposition process chosen from a chemical vapor deposition process and an atomic layer deposition process using at least one precursor having the structures A through G.

In another aspect, there is provided a method of forming a Group IV or Group V transition metal oxide or nitride film via an atomic layer deposition process or ALD-like process, the method comprising the steps of:
a. providing a substrate in a reaction chamber;
b. introducing into the reaction chamber at least organometallic compound having the structures A to G;
c. purging the reactor with a purge gas;
d. introducing an oxygen-containing or nitrogen-containing source into the reaction chamber; and
e. purging the reaction chamber with a purge gas; wherein steps b through e are repeated until a desired thickness of the film is obtained.

The organometallic precursors having the structures A to G and the compositions comprising them are preferably in a liquid form under delivery conditions, with a melting point of 120 degrees Celsius or less, 70 degrees Celsius or less, 60 degrees Celsius or less, 50 degrees Celsius or less, 40 degrees Celsius or less, or 30 degrees Celsius or less.

Preferred Group V and VI transition metal-containing films include, but are not limited to, vanadium oxide, vanadium nitride, molybdenum oxide, molybdenum nitride, niobium oxide, niobium nitride, tungsten oxide and tungsten nitride films.

DETAILED DESCRIPTION

Figure 1:
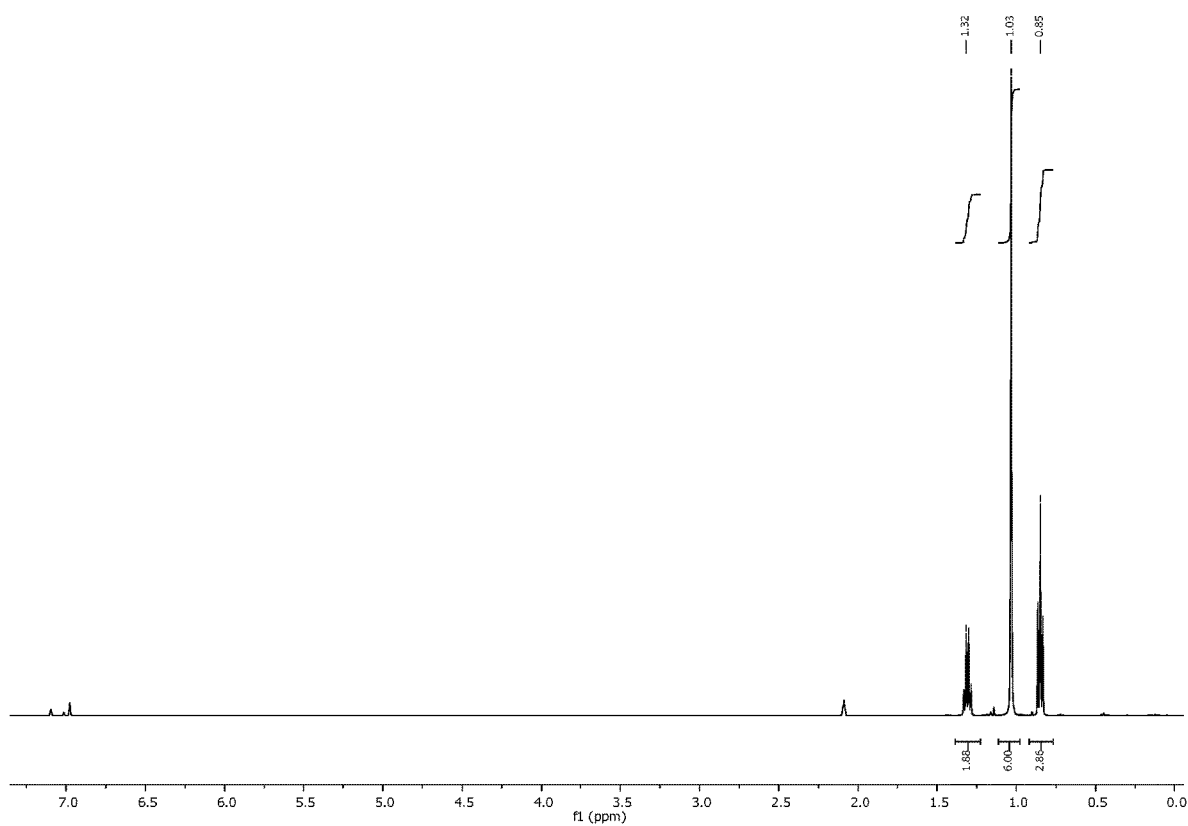
FIG. 1 is an illustration of the 1H NMR of Trichloro(tert-Amylimino)Vanadium(V) in Toluene-$C_7D_8$

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

Described herein are Group V and VI compounds and compositions comprising Group V and VI precursors used for depositing Group V and VI-containing films (e.g., vanadium oxide, vanadium nitride, molybdenum, molybdenum oxide, molybdenum nitride, niobium oxide, niobium nitride, tungsten oxide, tungsten nitride etc.).

Examples of Group V and VI precursor compounds include, but are not limited to, Group V and VI Cp amide imide or Group V and VI alkylimide trichloride compounds.

Examples of Group V and VI-containing films include, but are not limited to, vanadium, vanadium oxide films, vanadium nitride, vanadium oxynitride, molybdenum, molybdenum oxide films, molybdenum nitride, molybdenum oxynitride, niobium oxide, niobium nitride, tungsten, tungsten oxide films, tungsten nitride, and/or tungsten oxynitride films. Examples of surfaces for deposition of Group V and VI-containing films include, but are not limited to, metals, metal oxides, metal nitrides, silicon, germanium, germanium doped silicon, boron doped silicon, silicon oxide, silicon nitride, and/or silicon oxynitride.

The Precursors and Precursor Compositions

Precursors suitable as CVD and ALD precursors for depositing Group V and VI transition metal-containing films have one of the chemical structures A through G as shown below:

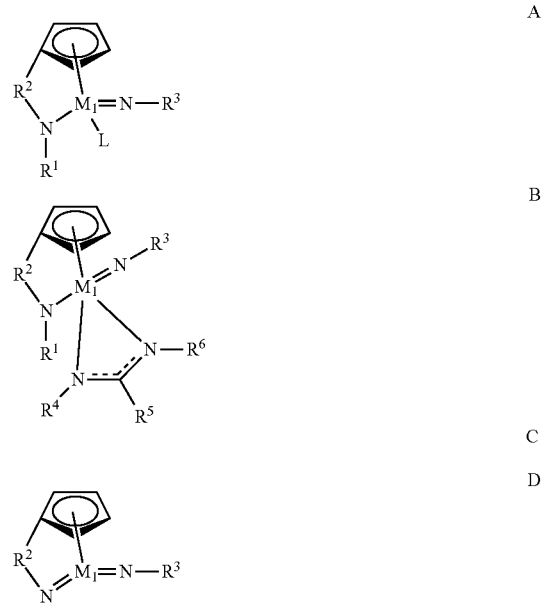

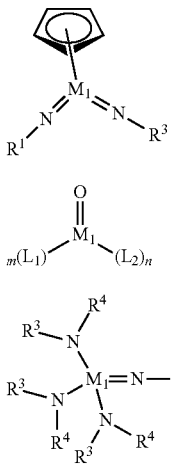

Wherein:
M₁ is V, Nb, Ta, Cr, Mo or W;
X is a halide selected from chloride (Cl), bromide (Br) and iodide (I);
R¹ is a linear or branched C₁-C₁₀ alkyl, an amino group or an ether group for structures (A) and (B); and is a linear or branched C₁-C₁₀ alkyl, an amino group or an ether group but not tert-butyl for structures (C) and (G);
R² is a linear or branched C₂-C₁₀ alkylene;
R³⁻⁴ and R⁶ are independently selected from a linear or branched C₁-C₁₀ alkyl, an amino group or an ether group;
R⁵ is hydrogen or a linear or branched C₁-C₁₀ alkyl,
L is R¹, OR¹ or NR¹R³;
L₁ is a Cp or substituted Cp;
L₂ is NR¹R³;
m has a value of 0, 1, 2; and
n has a value of 1, 2, 3 or 4.

In structures A, B, D, E, a cyclopentadienyl (C₅H₅) ligand (Cp) is bound to the transition metal. All five carbon atoms of the Cp ligand are bound to the metal center in η⁵-coordination by π bonding, therefore the precursors of the invention are π complexes. In some embodiments, the Cp ligand can have one or more linear or branched C₁-C₁₀ alkyl bonded to the five-membered aromatic ring.

In an embodiment, the precursor has chemical structure selected from the group consisting of: B; C, D, E, F, and G.

In an embodiment, a composition comprises: (a) the precursor, and (b) at least one solvent. Preferred solvents include, without limitation, ether, tertiary amine, alkyl hydrocarbon, aromatic hydrocarbon, siloxanes, tertiary aminoether, and combinations thereof. In embodiments, the difference between the boiling point of the precursor and the boiling point of the solvent is 40 degrees Celsius or less, preferably less than about 20 degrees Celsius, more preferably less than 10 degrees Celsius.

In the structures and text throughout the description, the term "alkyl" denotes a linear or branched functional group having from 1 to 10 or 1 to 4 carbon atoms. Exemplary linear alkyl groups include, but are not limited to, methyl, ethyl, n-propyl, n-butyl, n-pentyl, and hexyl. Exemplary branched alkyl groups include, but are not limited to, iso-propyl, iso-butyl, sec-butyl, tert-butyl, iso-pentyl, tert-pentyl, and iso-hexyl. In certain embodiments, the alkyl group may have one or more functional groups such as, but not limited to, an alkoxy group, a dialkylamino group, or combinations thereof, attached thereto. In other embodiments, the alkyl group does not have one or more functional groups attached thereto.

In the structures above and text throughout the description, the term "alkylene" denotes a hydrocarbon group having from 1 to 10 or from 4 to 10 carbon atoms or from 5 to 10 carbon atoms which are connected to two carbon atoms. Exemplary alkylene groups include, but are not limited to, methylene (—CH₂—), ethylene (—CH₂CH₂—), propylene (—CH₂CH₂CH₂—), and iso-propylene (—CH(Me)CH₂—).

In the structures and text throughout the description alkyl and alkylene functional groups are represented by the following abbreviations: methyl/methylene (Me/—CH₂—); ethyl/ethylene (Et/—CH₂CH₂—); isopropyl/isopropylene (Pr$^i$/—CH(Me)CH₂—); n-propyl/n-propylene (Pr$^n$/—CH₂CH₂CH₂—), tert-amyl (Amyl$^t$/—C(CH₃)₂(CH₂CH₃)) and sec-butyl (Bu$^s$/—CH(CH₃)(CH₂CH₃)).

The term "Cp ligand" refers to a cyclopentadienyl (C₅H₅) or alkyl substituted cyclopentadienyl ligand which is bound to a transition metal. In the text of the claims and the disclosure, and the structural formulae therein, the Cp ligand is represented by "Cp". As used herein, all five carbon atoms of the Cp ligand are bound to the metal center in η⁵-coordination by π bonding, therefore the precursors of the invention are π complexes. Exemplary Cp groups include, but are not limited to, cyclopentadienyl (C₅H₅), methylcyclopentadienyl (MeC₅H₄), ethylcyclopentadienyl (EtC₅H₄), iso-propylcyclopentadienyl (iPrC₅H₄).

The ALD-like process is defined herein as a cyclic CVD process that provides a high conformal Group V and VI-containing films on a substrate as shown by having at least one of the following: percentage of non-uniformity of about 5% or less as measured by ellipsometer, a deposition rate of 0.1 Angstrom or greater per cycle, or a combination thereof.

In an embodiment, the organometallic compounds according to the present invention and compositions comprising the organometallic compounds according to the present invention are preferably substantially free of halide or halide ions. As used herein, the term "substantially free" as it relates to halide ions (or halides) such as, for example, chlorides and fluorides, bromides, and iodides, means less than 5 ppm (by weight), preferably less than 3 ppm, more preferably less than 1 ppm, and most preferably 0.001 ppm. As used herein, the term "free of" as it relates to halide or halide ions or other impurities means 0.0001 ppm.

In some embodiments, the precursors having structures A, B; C, D, E, F, and G are free of metal ions such as, Li⁺, Na⁺, K⁺, Mg²⁺, Ca²⁺, Al³⁺, Fe²⁺, Fe²⁺, Fe³⁺, Ni²⁺, and Cr³⁺. As used herein, the term "substantially free of metal impurities" relates to Li, Na, K, Mg, Ca, Al, Fe, Ni, Cr, and noble metals including, but not limited to, volatile Ru or Pt complexes from ruthenium or platinum catalysts used in the synthesis, and means less than 1 ppm, preferably 0.1 ppm (by weight) of total combined metal impurities as measured by ICP-MS or other analytical method for measuring metals. In addition, the precursors having structures A, B; C, D, E, F, and G are preferably to have purity of 98 wt. % or higher, more preferably 99 wt. % or higher as measured by proton NMR when used as precursor to deposit metal-containing films.

In another aspect, the present invention discloses a composition comprising a Group V and VI compound and a melting point depression additive to lower the melting point of the composition below at least 20 degrees Celsius. The melting point depression additive may comprise a low volatility inert substance, for example a long chain, branched or cyclic saturated hydrocarbon $C_nH_{n+2}$, where n has a value of 10 to about 20, a substituted arene, an organoamine, an aminoether, an ether, and a combination thereof.

Preferred organometallic compound precursors having structure A include but are not limited to:

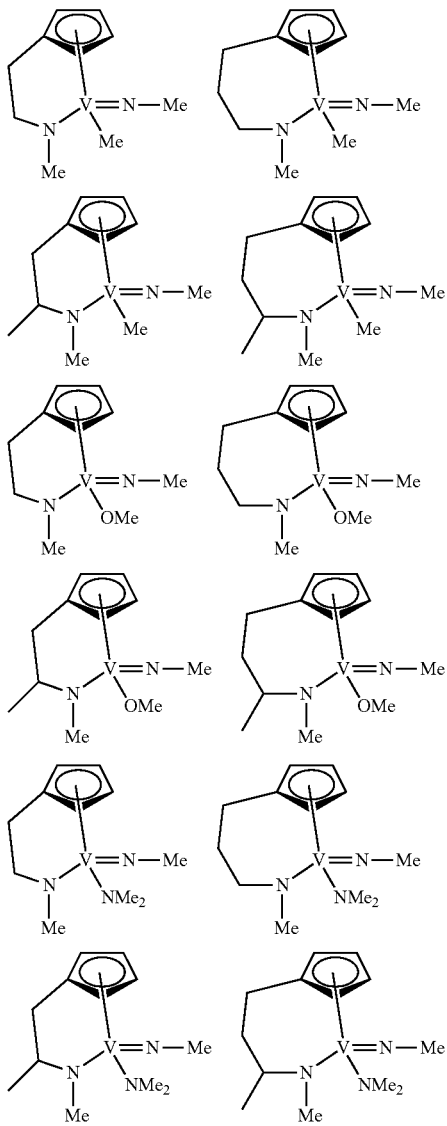

Preferred organometallic compound precursors having structure B include but are not limited to:

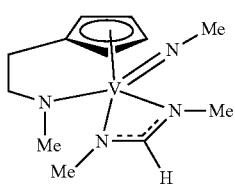

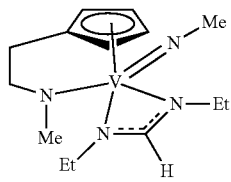

Preferred organometallic compound precursors having structure C include but are not limited to:

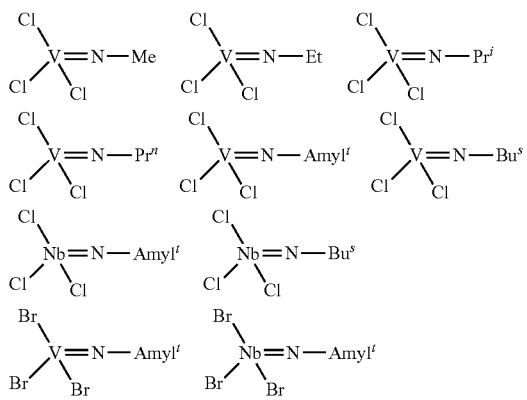

Preferred organometallic compound precursors having structure D include but are not limited to:

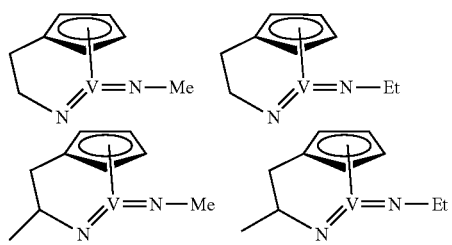

Preferred organometallic compound precursors having structure E include but are not limited to:

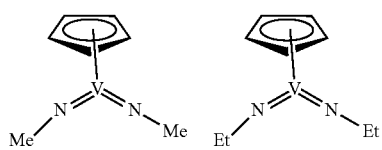

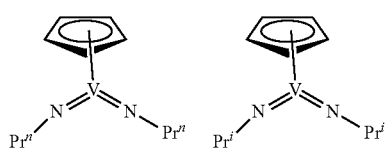

Preferred organometallic compound precursors having structure F include but are not limited to:

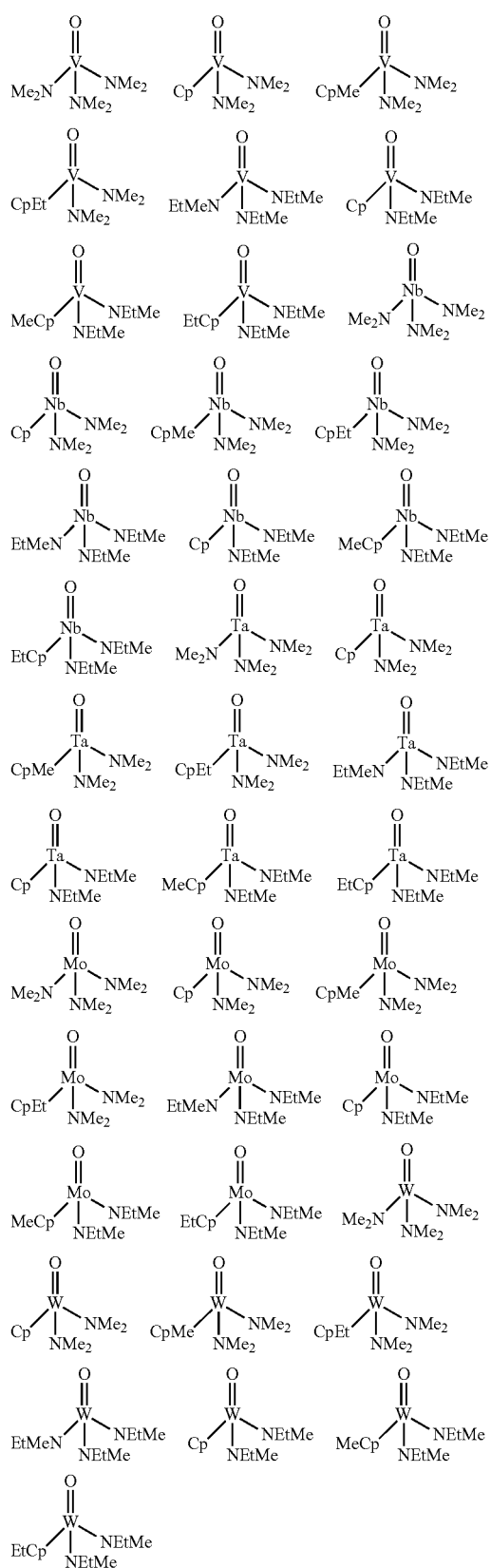

Preferred organometallic compound precursors having structure G include but are not limited to:

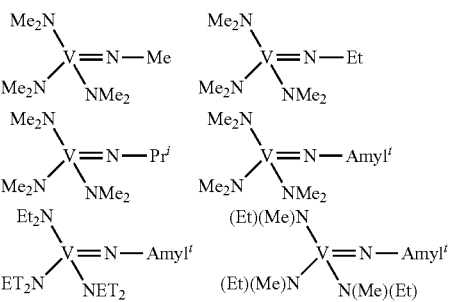

Methods of Using the Precursors and Precursor Compositions

In an embodiment, a method of forming a metal oxide or metal nitride film via an atomic layer deposition process or ALD-like process, comprises the steps of:
 a. providing a substrate in a reactor;
 b. introducing into the reactor at least one organometallic compound having the structures A to G;
 c. purging the reactor with a first purge gas;
 d. introducing an oxygen-containing or nitrogen-containing source into the reactor; and
 e. purging the reactor with a second purge gas; wherein steps b through e are repeated until a desired thickness of the film is obtained.
 the first and second purge gases may be the same or different.

In an embodiment, the metal-containing films deposited using the methods described herein are formed in the presence of nitrogen-containing source. A nitrogen-containing source may be introduced into the reactor in the form of at least one nitrogen-containing source and/or may be present incidentally in the other precursors used in the deposition process. Suitable nitrogen-containing source gases may include, for example, ammonia, hydrazine, monoalkylhydrazine, dialkylhydrazine, nitrogen, nitrogen/hydrogen, ammonia plasma, nitrogen plasma, nitrogen/hydrogen plasma, and mixture thereof.

In an embodiment, the nitrogen-containing source comprises an ammonia plasma or hydrogen/nitrogen plasma source gas that is introduced into the reactor at a flow rate ranging from about 1 to about 2000 square cubic centimeters (sccm) or from about 1 to about 1000 sccm. The nitrogen-containing source can be introduced for a time that ranges from about 0.1 to about 100 seconds. In embodiments wherein the film is deposited by an ALD or a cyclic CVD process, the precursor pulse can have a pulse duration that is greater than 0.01 seconds, and the nitrogen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In an embodiment, the metal-containing films deposited using the methods described herein are formed in the presence of oxygen using an oxygen-containing source, reagent or precursor comprising oxygen. An oxygen-containing source may be introduced into the reactor in the form of at least one oxygen-containing source and/or may be present incidentally in the other precursors used in the deposition process. Suitable oxygen-containing source gases may include, for example, water ($H_2$) (e.g., deionized water, purifier water, and/or distilled water), hydrogen peroxide ($H_2O_2$), oxygen ($O_2$), oxygen plasma, ozone ($O_3$), NO, $N_2O$, $NO_2$, carbon monoxide (CO), carbon dioxide ($CO_2$) and combinations thereof.

In an embodiment, the oxygen-containing source comprises an oxygen-containing source gas that is introduced into the reactor at a flow rate ranging from about 1 to about 2000 square cubic centimeters (sccm) or from about 1 to about 1000 sccm. The oxygen-containing source can be introduced for a time that ranges from about 0.1 to about 100 seconds. In an embodiment, the oxygen-containing source comprises water having a temperature of 10 degrees Celsius or greater. In embodiments wherein the film is deposited by an ALD or a cyclic CVD process, the precursor pulse can have a pulse duration that is greater than 0.01 seconds, and the oxygen-containing source can have a pulse duration that is less than 0.01 seconds, while the water pulse duration can have a pulse duration that is less than 0.01 seconds. In yet another embodiment, the purge duration between the pulses that can be as low as 0 seconds or is continuously pulsed without a purge in-between.

In an embodiment, there is provided a method of forming a metal film via an atomic layer deposition process or ALD-like process, the method comprising the steps of:
 a. providing a substrate in a reaction chamber;
 b. introducing into the reaction chamber at least one organometallic compound having the structures A to G;
 c. purging the reactor with a first purge gas;
 d. introducing a reducing agent source into the reaction chamber; and
 e. purging the reaction chamber with a second purge gas; wherein steps b through e are repeated until a desired thickness of the film is obtained.
 the first and second purge gases may the same or different.

In an embodiment, the metal-containing films deposited using the methods described herein are formed in the presence of a reducing agent source. A reducing agent source may be introduced into the reactor in the form of at least one reducing agent source and/or may be present incidentally in the other precursors used in the deposition process. Suitable reducing agent source gases may include, for example, hydrogen, hydrogen plasma, hydrogen/helium, hydrogen/argon, hydrogen/helium plasma, hydrogen/argon plasma, boron-containing compounds such as diborane, and silicon-containing compounds such as silane and diethylsilane.

In an embodiment, a method of deliver Group V and VI precursor, comprises:
 providing an organometallic precursor having structures A to G; and
 providing an organometallic precursor having structures A to G container having a delivery temperature;
 wherein the organometallic precursor having structures A to G is contained in the container and melting point of the Group V and VI precursor is less than the delivery temperature.

The metal containing film is preferably deposited by using a Group V and VI compound in a liquid form with a melting point of 120 degrees Celsius or less, 70 degrees Celsius or less, 60 degrees Celsius or less, 50 degrees Celsius or less, 40 degrees Celsius or less, or 30 degrees Celsius or less; preferably the meting point is 60 degrees Celsius or less, most preferably the meting point is 30 degrees Celsius or less. Thus the precursor is in liquid phase in a container when used for delivering into a reactor chamber during semi-conductor manufacturing process.

In general, the precursor delivery rate (precursor flux) is more reproducible and easier to control when delivering a precursor which is in the liquid state versus the solid state. In addition, when the precursor is in the liquid state under the delivery conditions, the use of bubblers and/or spargers is possible. In general, bubbling the carrier gas through the liquid results in a higher precursor flux due to higher saturation of the carrier gas with precursor vapor. This enables the use of lower delivery temperatures to achieve a useful precursor flux, limiting the thermal decomposition of the precursor.

The metal containing film includes, but is not limited to, vanadium oxide film, vanadium silicide film, and vanadium nitride film.

The Group V and VI or complexes or compositions described herein are highly suitable for use as volatile precursors for ALD, CVD, pulsed CVD, plasma enhanced ALD (PEALD) or plasma enhanced CVD (PECVD) for the manufacture of semiconductor type microelectronic devices. Examples of suitable deposition processes for the method disclosed herein include, but are not limited to, cyclic CVD (CCVD), MOCVD (Metal Organic CVD), thermal chemical vapor deposition, plasma enhanced chemical vapor deposition ("PECVD"), high density PECVD, photon assisted CVD, plasma-photon assisted ("PPECVD"), cryogenic chemical vapor deposition, chemical assisted vapor deposition, hot-filament chemical vapor deposition, CVD of a liquid polymer precursor, deposition from supercritical fluids, and low energy CVD (LECVD). In certain embodiments, the metal containing films are deposited via atomic layer deposition (ALD), plasma enhanced ALD (PEALD) or plasma enhanced cyclic CVD (PECCVD) process.

As used herein, the term "chemical vapor deposition processes" refers to any process wherein a substrate is exposed to one or more volatile precursors, which react and/or decompose on the substrate surface to produce the desired deposition. As used herein, the term "atomic layer deposition process" refers to a self-limiting (e.g., the amount of film material deposited in each reaction cycle is constant), sequential surface chemistry that deposits films of materials onto substrates of varying compositions. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the metal-containing film is deposited using an ALD process. In another embodiment, the metal-containing film is deposited using a CCVD process. In a further embodiment, the metal-containing film is deposited using a thermal CVD process. The term "reactor" as used herein, includes without limitation, reaction chamber, reaction vessel or deposition chamber.

In certain embodiments, the method disclosed herein avoids pre-reaction of the metal precursors by using ALD or CCVD methods that separate the precursors prior to and/or during the introduction to the reactor.

In an embodiment, the process employs an oxidizing agent. The oxidizing agent is typically introduced in gaseous form. Examples of suitable oxidizing agents include, but are not limited to, oxygen gas, water vapor, ozone, oxygen plasma, or mixtures thereof.

The deposition methods disclosed herein may involve one or more purge gases. The purge gas, which is used to purge away unconsumed reactants and/or reaction byproducts, is an inert gas that does not react with the precursors. Exemplary purge gases include, but are not limited to, argon (Ar), nitrogen (N$_2$), helium (He), neon, and mixtures thereof. In certain embodiments, a purge gas such as Ar is supplied into the reactor at a flow rate ranging from about 10 to about 2000 sccm for about 0.1 to 10000 seconds, thereby purging the unreacted material and any byproduct that may remain in the reactor.

Energy may be applied to the at least one of the precursors, oxidizing agent, other precursors or combination thereof to induce reaction and to form the metal-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

The Group V and VI metal precursors may be delivered to the reaction chamber such as a CVD or ALD reactor in a variety of ways. In one embodiment, a liquid delivery system may be utilized. In an alternative embodiment, a combined liquid delivery and flash vaporization process unit may be employed, such as, for example, the turbo vaporizer manufactured by MSP Corporation of Shoreview, MN, to enable low volatility materials to be volumetrically delivered, which leads to reproducible transport and deposition without thermal decomposition of the precursor. The precursor compositions described in this application can be effectively used as source reagents via direct liquid injection (DLI) to provide a vapor stream of these Group V and VI metal precursors into an ALD or CVD reactor.

In an embodiment, these precursor compositions include hydrocarbon solvents which are particularly desirable due to their ability to be dried to sub-ppm levels of water. Exemplary hydrocarbon solvents that can be used in the precursor compositions include, but are not limited to, toluene, mesitylene, cumene (isopropylbenzene), p-cymene (4-isopropyl toluene), 1,3-diisopropylbenzene, octane, dodecane, 1,2,4-trimethylcyclohexane, n-butylcyclohexane, and decahydronaphthalene (decalin). The precursor compositions of this application can also be stored and used in stainless steel containers. In certain embodiments, the hydrocarbon solvent in the composition is a high boiling point solvent or has a boiling point of 100 degrees Celsius or greater. The precursor compositions of this application can also be mixed with other suitable metal precursors, and the mixture used to deliver both metals simultaneously for the growth of a binary metal-containing films.

In certain embodiments, the gas lines connecting from the precursor canisters to the reaction chamber are heated to one or more temperatures depending upon the process requirements and the container comprising the composition is kept at one or more temperatures for bubbling. In other embodiments, a metal precursor composition is injected into a vaporizer kept at one or more temperatures for direct liquid injection.

A flow of argon and/or other gas may be employed as a carrier gas to help deliver the vapor of at least one Group V and VI metal precursor to the reaction chamber during the precursor pulsing. In certain embodiments, the reaction chamber process pressure is between 1 and 50 torr, preferably between 5 and 20 torr.

Substrate temperature is an important process variable in the deposition of high-quality Group V and VI metal-containing films. Typical substrate temperatures range from about 150 degrees Celsius to about 550 degrees Celsius. Higher temperatures can promote higher film growth rates. It is therefore desirable to find Group V and VI metal precursors that can deposit Group V and VI metal-containing films at high temperatures without decomposition.

It is generally accepted in the art of metal-containing film deposition that precursors which are liquid under the metal-containing film deposition process conditions are preferred vs. precursors which are solids under the metal-containing film deposition process conditions. Reasons include, but are not limited to, the ability to deliver the precursor more uniformly to the metal-containing film deposition process vs. sublimation of solid precursors. In one embodiment the carrier gas is bubbled through the metal-containing film precursor under suitable process conditions. Bubbling the gas through the liquid is an effective means of creating greater gas-liquid contact time and area, which aids in achieving a gas stream that is saturated with the evaporated liquid precursor. Achieving saturated carrier gas maximizes the delivery rate of the precursor and is generally beneficial to the operation of the deposition process.

In another embodiment, the jet of carrier gas is directed vertically downward at a 90° angle or perpendicular to the surface of the liquid chemical precursor. In this or other embodiments, the jet of carrier gas impinges on the surface of the liquid chemical precursor, thereby reducing the mass transport limitations that occur in other designs, such as bubbler designs, where the carrier gas is not directed onto the surface of the liquid chemical precursor. The jet of carrier gas is designed such that it has sufficient momentum to perturb the surface of the liquid chemical precursor regardless of the liquid level in the container, but insufficient momentum to generate significant splashing at the site of impingement. Container designs for jet-type delivery of liquid precursors are provided in US20160333477 and US20170327945 (which are incorporated herein by reference).

EXAMPLES

Example 1

Trichloro(tert-amylimino)vanadium(V)

4.4 g tert-amylamine (50 mmol) was dissolved in 60 mL anhydrous hexane, the solution was dried overnight with activated 4 Å molecular sieves. The next day, the tert-amylamine solution was added dropwise to a solution of 13.1 g VOCl$_3$ (76 mmol) in 90 mL anhydrous hexane at −78° C. over the course of 1 hr. After that, the reaction was warmed slowly to room temperature and stirred overnight. After 24 h, the stirring was stopped, and the reaction suspension was allowed to settle for 1 hour before the solution was filtered under N$_2$. The filtrate was dried under vacuum and 2.3 g dark orange liquid was obtained. It was further dried under vacuum to afford 1.9 g solid (crude yield 10%).

The crude product was further purified by sublimation under vacuum (20 mtorr). The sublimer was first pumped under vacuum at room temperature for several hours to remove any residual VOCl$_3$. A Liquid nitrogen trap was placed between the sublimer and the Schlenk line to prevent VOCl$_3$ from contaminating the Schlenk line. After that, dry ice was added to the cold finger and the sublime temperature was raised to 40° C. After 2 hours, dark green crystalline solid was collected on the cold finger, leaving brown residual at the sublimer.

Figure 2:
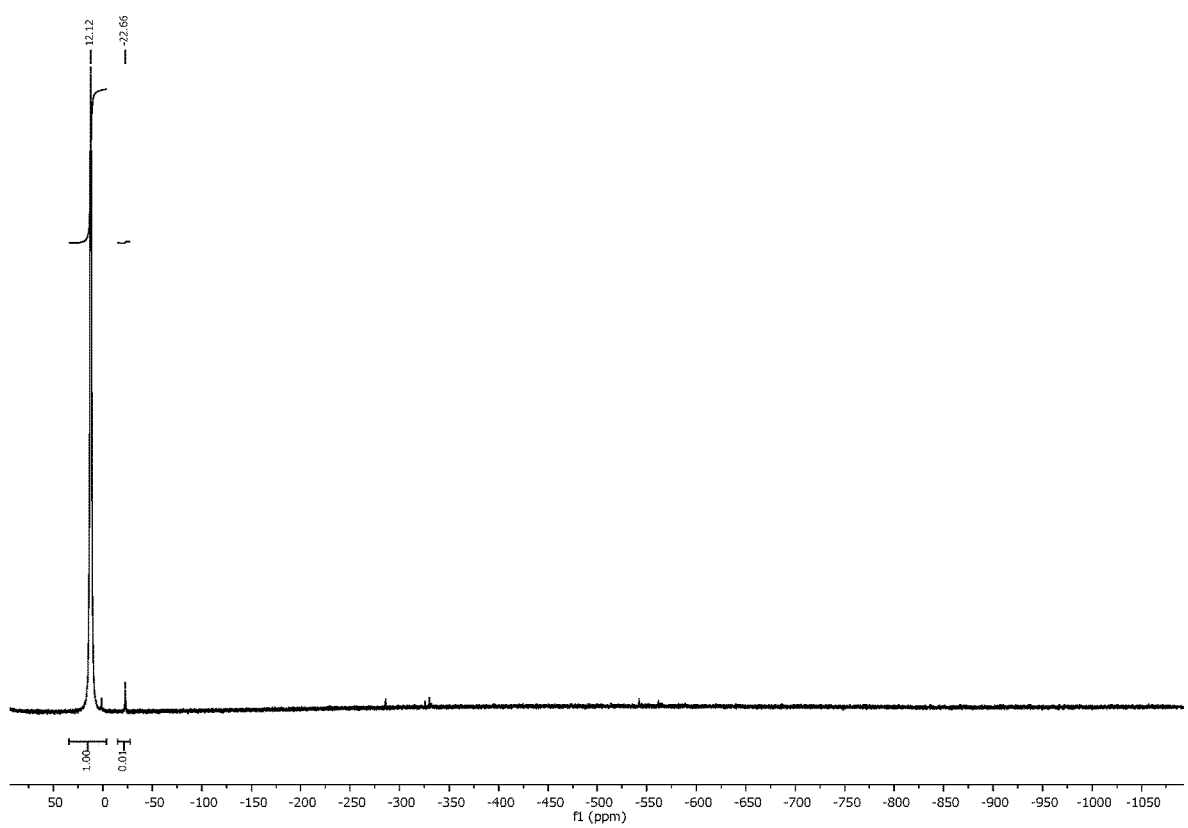
FIG. 2 is an illustration of the 51V NMR of Trichloro (tert-Amylimino)Vanadium(V) in Toluene-$C_7D_8$

1H NMR (400 MHz, D8 toluene) δ=1.32 (q, 2H), δ=1.03 (s, 6H), δ=0.85 (t, 3H), was shown in FIG. 1. 51V NMR (400 MHz) δ=−12.1, was shown in FIG. 2.

Figure 3:
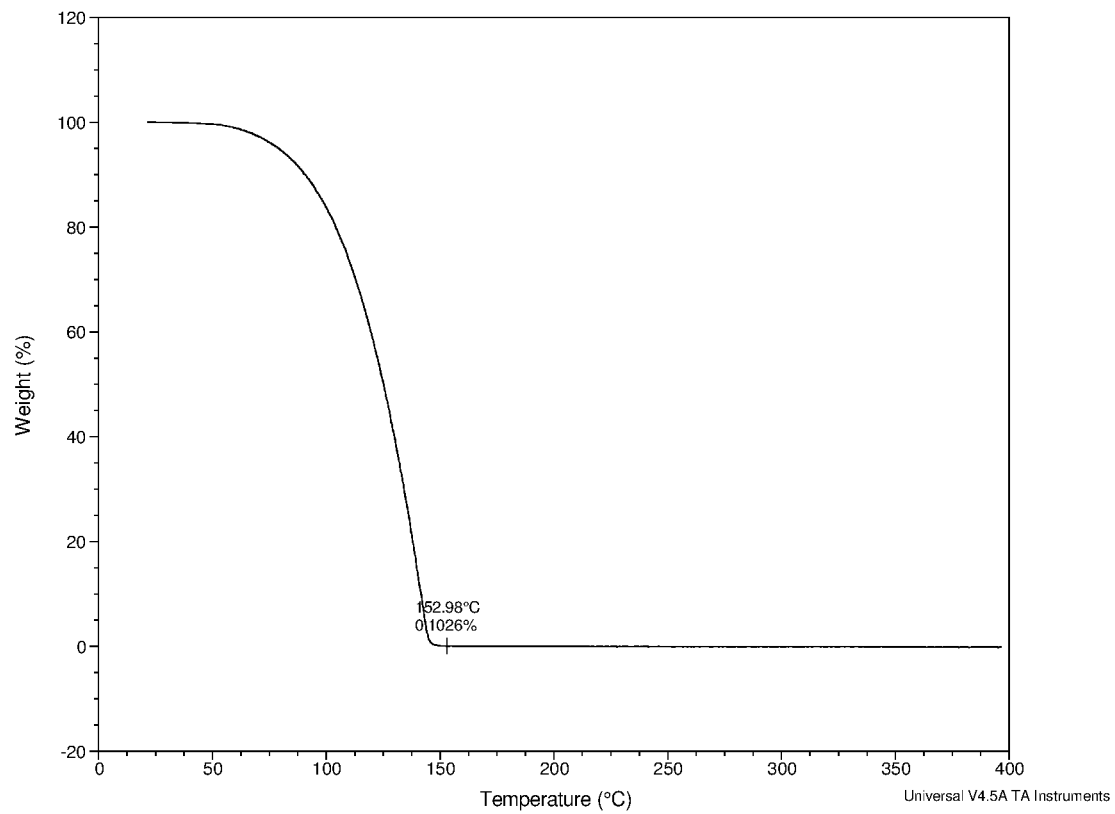
FIG. 3 is an illustration of the thermogravimetric analysis (TGA) of Trichloro(tert-Amylimino)Vanadium(V)
Figure 4:
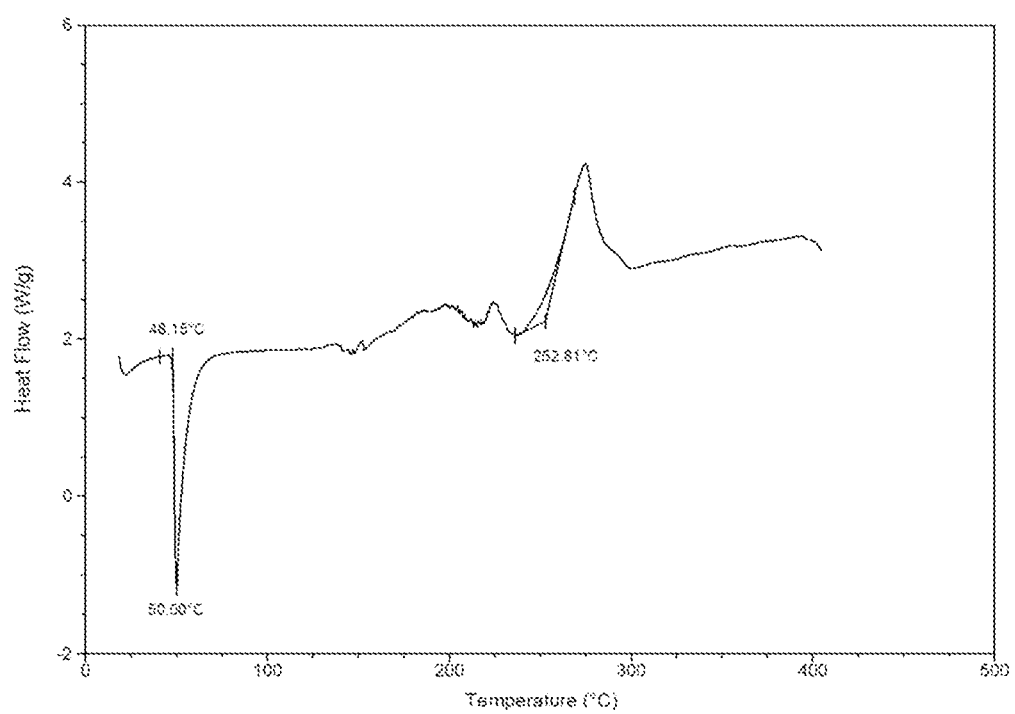
FIG. 4 is an illustration of the differential scanning calorimetry (DSC) of Trichloro(tert-Amylimino)Vanadium (V), demonstrating that trichloro(tert-Amylimino)Vanadium (V) is thermally stable up to 250° C. and lower melting point of about 48° C.

The compound was also characterized by thermogravimetric analysis (TGA) as shown in FIG. 3, and differential scanning calorimetry (DSC) as shown in FIG. 4.

FIG. 4 also showed the melting point of 48° C. which is about >20° C. lower than that of trichloro(tert-butylimino) vanadium(V) (see Laurent, F., et al. *Journal of Materials Chemistry* 3(6): 659-663 (1993)), suggesting trichloro(tert-amylimino)vanadium(V) might be a better choice when employed as precursor during delivery in semi-conductor fabrication process.

Example 2

Tert-amylimino-tris(dimethylamino)vanadium(V)

Trichloro(tert-amylimino)vanadium(V) (1.27 g, 5.287 mmol) was dissolved in 50 mL anhydrous hexane in a 100 mL Schlenk flask. 812 mg LiNMe$_2$ (15.92 mmol, Sigma Aldrich) was added slowly within 10 minutes, no obvious exothermal observed. The flask was brought out of the glovebox and connected to the Schlenk line. After 24 hours of agitation, dark brown solution was formed, with light brown precipitate. After filtering off the solid, the dark brown solution was pumped under vacuum to yield get dark brown oil of 1.4 g.

Figure 5:
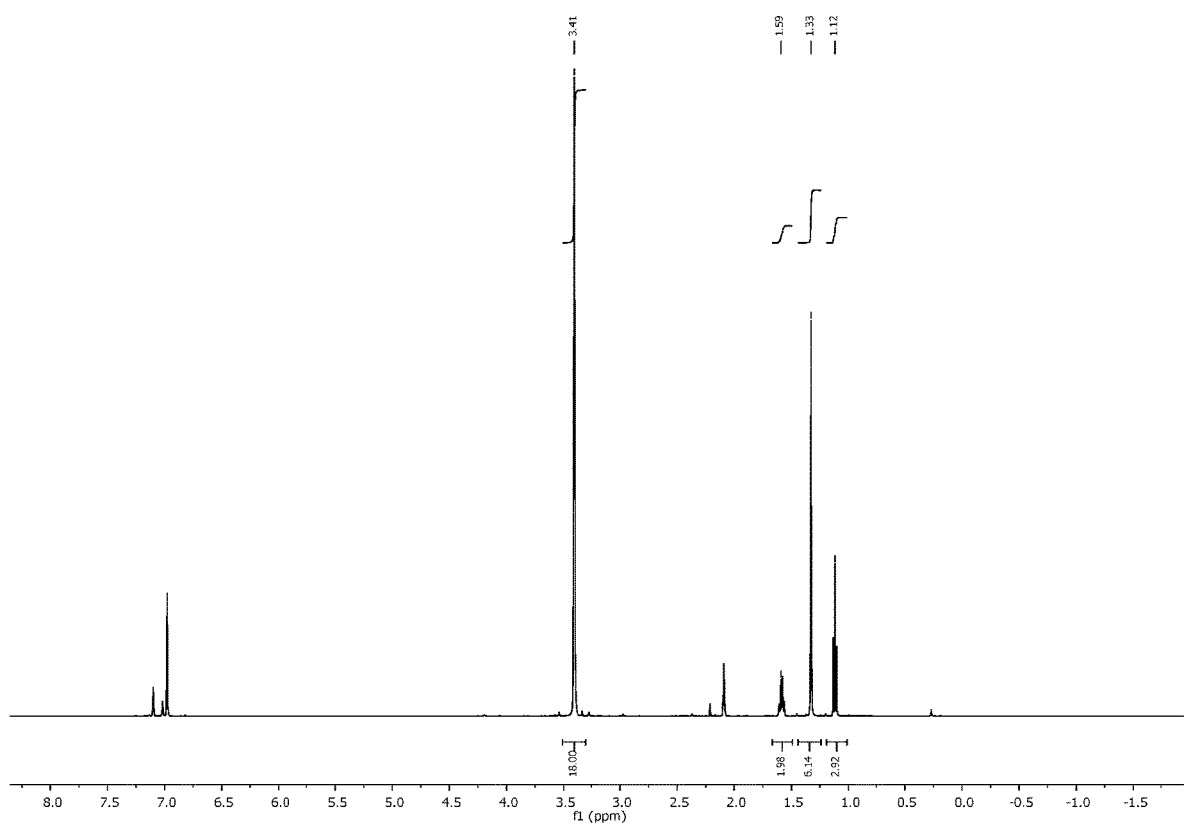
FIG. 5 is an illustration of the 1H NMR of Tert-Amylimino-tris(dimethylamino)Vanadium(V) in Toluene-$C_7D_8$
Figure 6:
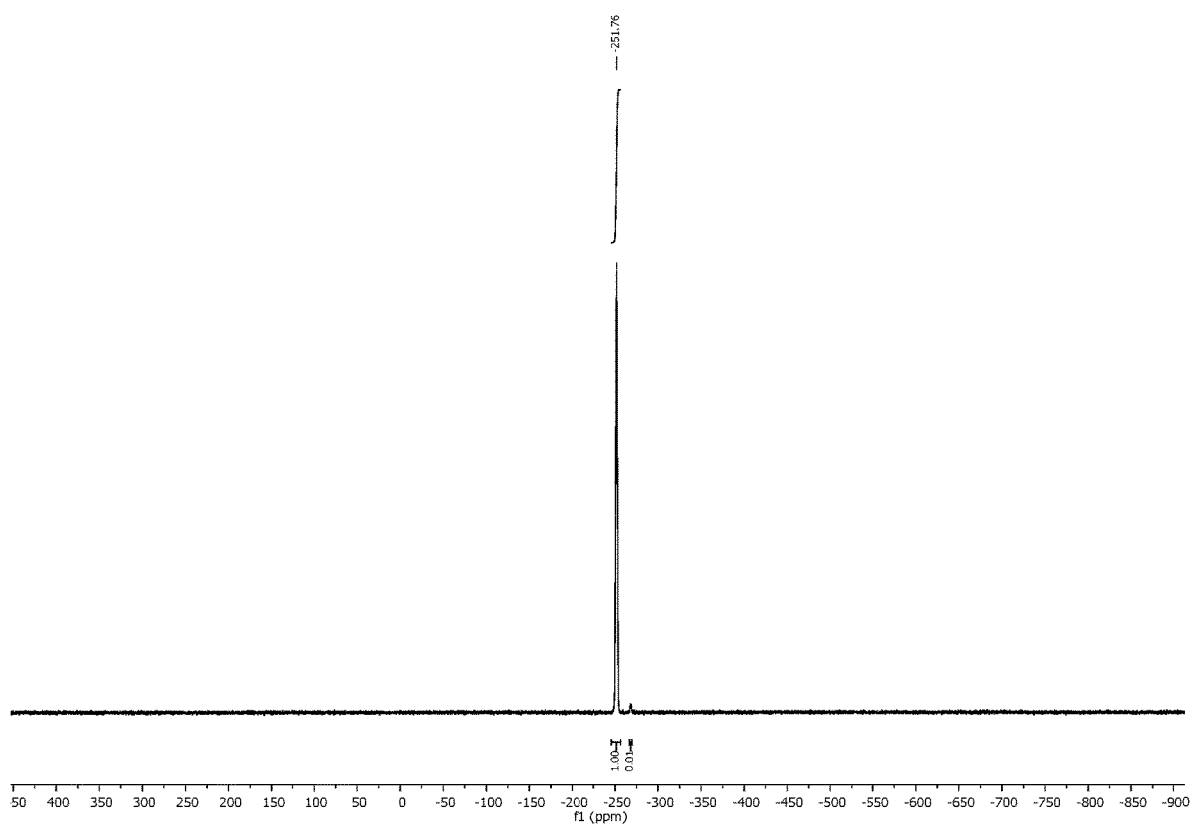
FIG. 6 is an illustration of the 51V NMR of Tert-Amylimino-tris(dimethylamino)Vanadium(V) in Toluene-$C_7D_8$
Figure 7:
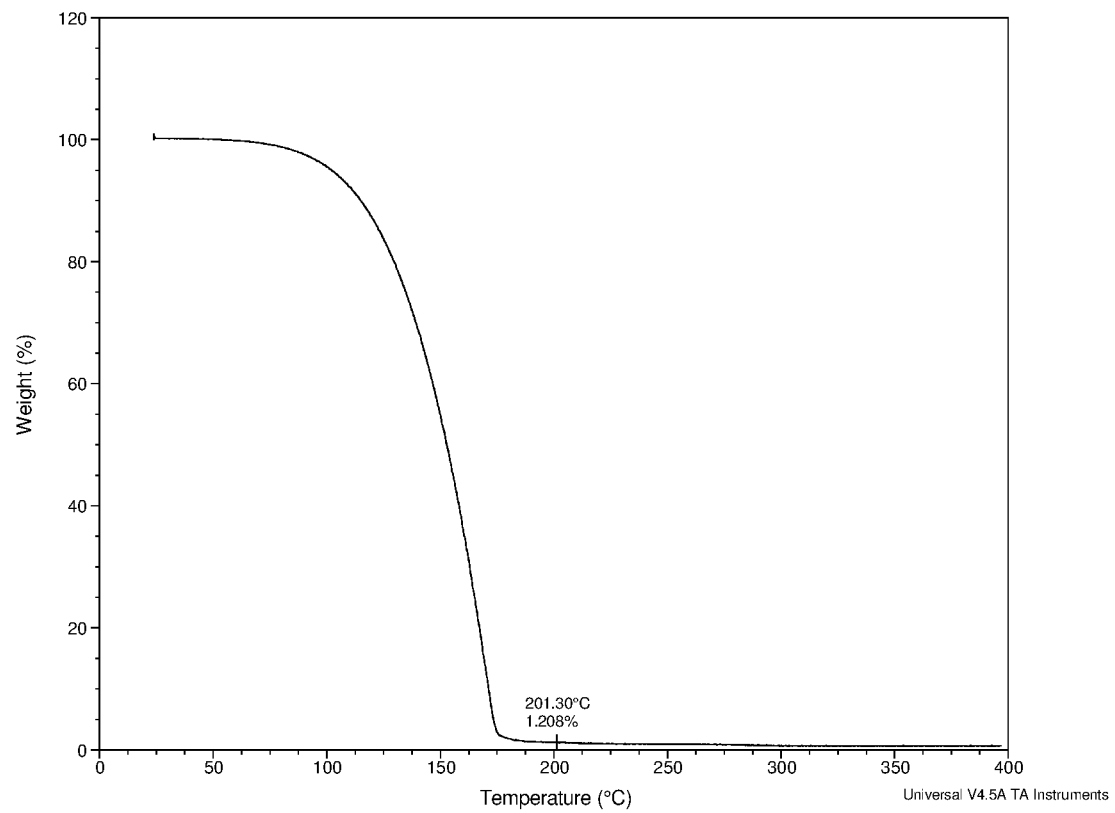
FIG. 7 is an illustration of the thermogravimetric analysis (TGA) of Tert-Amylimino-tris(dimethylamino)Vanadium (V)
Figure 8:
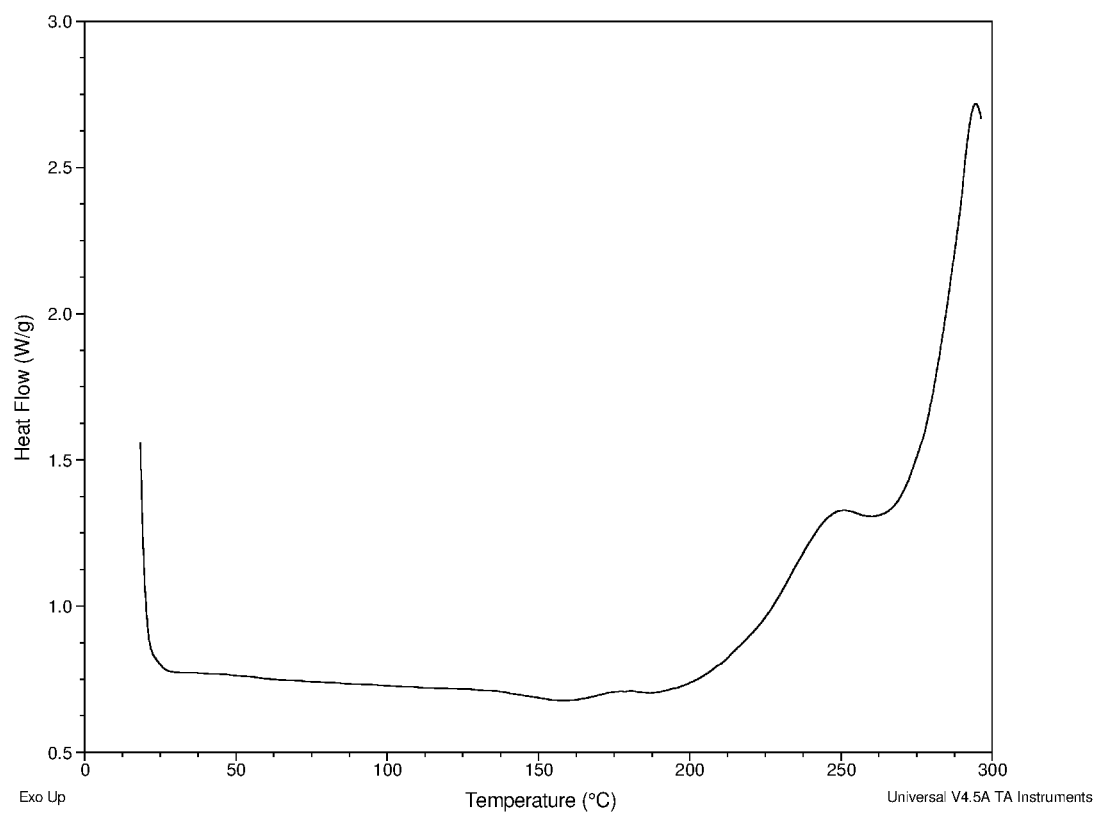
FIG. 8 is an illustration of the differential scanning calorimetry (DSC) of Tert-Amylimino-tris(dimethylamino) Vanadium(V), demonstrating Tert-Amylimino-tris(dimethylamino)Vanadium(V) is thermally stable up to 250° C.

The crude product was distilled at 80° C. under 0.1 torr vacuum to give 1.0 g of orange liquid as final product (total yield 71%). $^1$H NMR (400 MHz, D8 toluene) δ=3.41 (s, 18H), 1.59 (q, 2H), δ=1.33 (s, 6H), δ=1.12 (t, 3H), was shown in FIG. 5. 51V NMR (400 MHz) δ=−251.76, was shown in FIG. 6. The compound was also characterized by thermogravimetric analysis (TGA as shown in FIG. 7, and differential scanning calorimetry (DSC), as shown in FIG. 8.

Example 3

Trichloro(sec-butylimino)vanadium(V)

7.3 g sec-butylamine (0.1 mol) was dried in 100 mL anhydrous hexane using molecular sieves for 48 h. Inside the glovebox, to a 500 mL Schlenk flask was added 26 g VOCl$_3$ (0.15 mol) and 200 mL anhydrous hexane. The flask was transported to the fume hood and connected to the Schlenk line. The flask was allowed to cool down to −78° C. Sec-butylamine hexane solution was added slowly over the course of 1 h. The solution turned dark immediately. The solution was cooled under dry ice for another hour and then allow the solution to slowly warm up to room temperature. The burgundy reaction mixture was stirred at RT overnight. After overnight, the mixture separated into two phases. The mixture was allowed to settle for half an hour and the supernatant was transferred to a separate 500 mL Schlenk flask under N$_2$ using a cannula. The precipitate was washed with another 50 mL anhydrous hexane and then transferred over.

A 1 L flask immersed in liquid N$_2$ was placed in between the solution and the Schlenk line to serve as a solvent trap. The solvent and excess VOC$_3$ was removed under dynamic vacuum over the course of 2 h to yield 620 mg pale green solid crude product. TGA of the green solid indicates the crude contains ~18% NVR.

Figure 9:
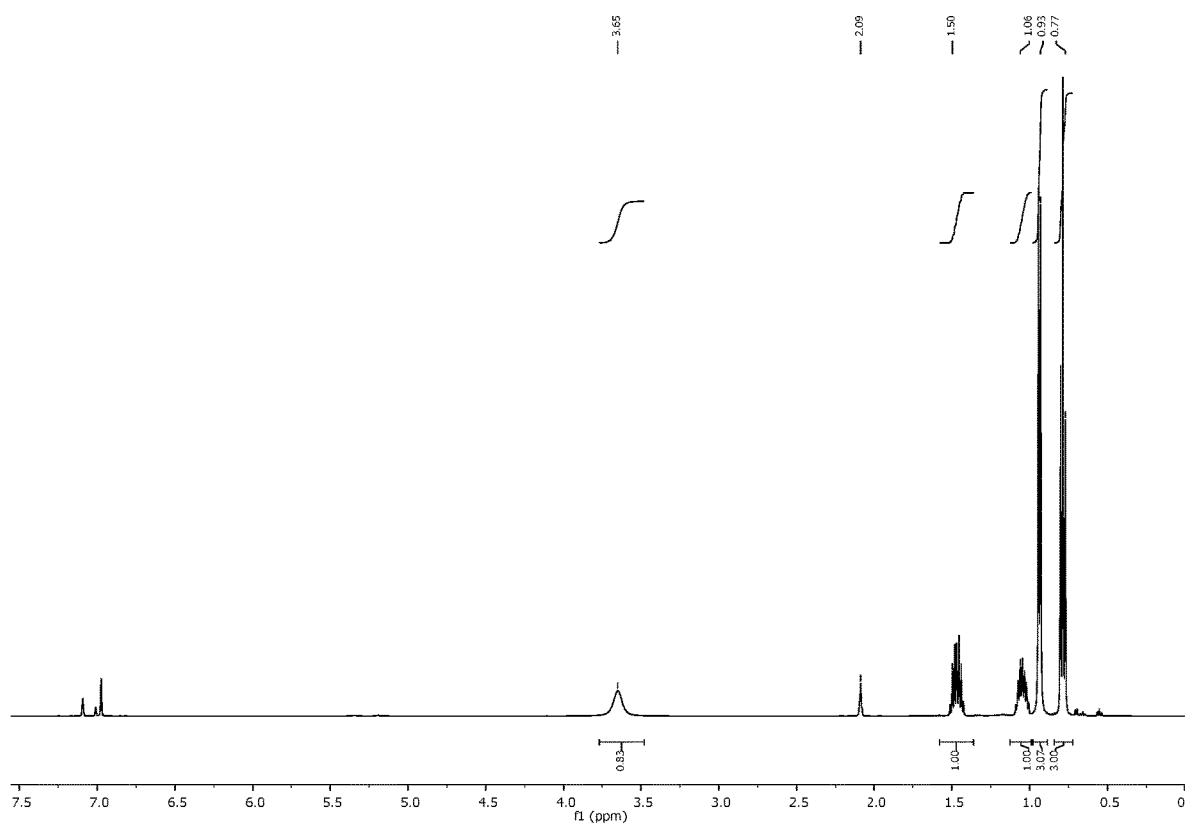
FIG. 9 is an illustration of the 1H NMR of Trichloro(sec-Butylimino)Vanadium(V) in Toluene-$C_7D_8$
Figure 10:
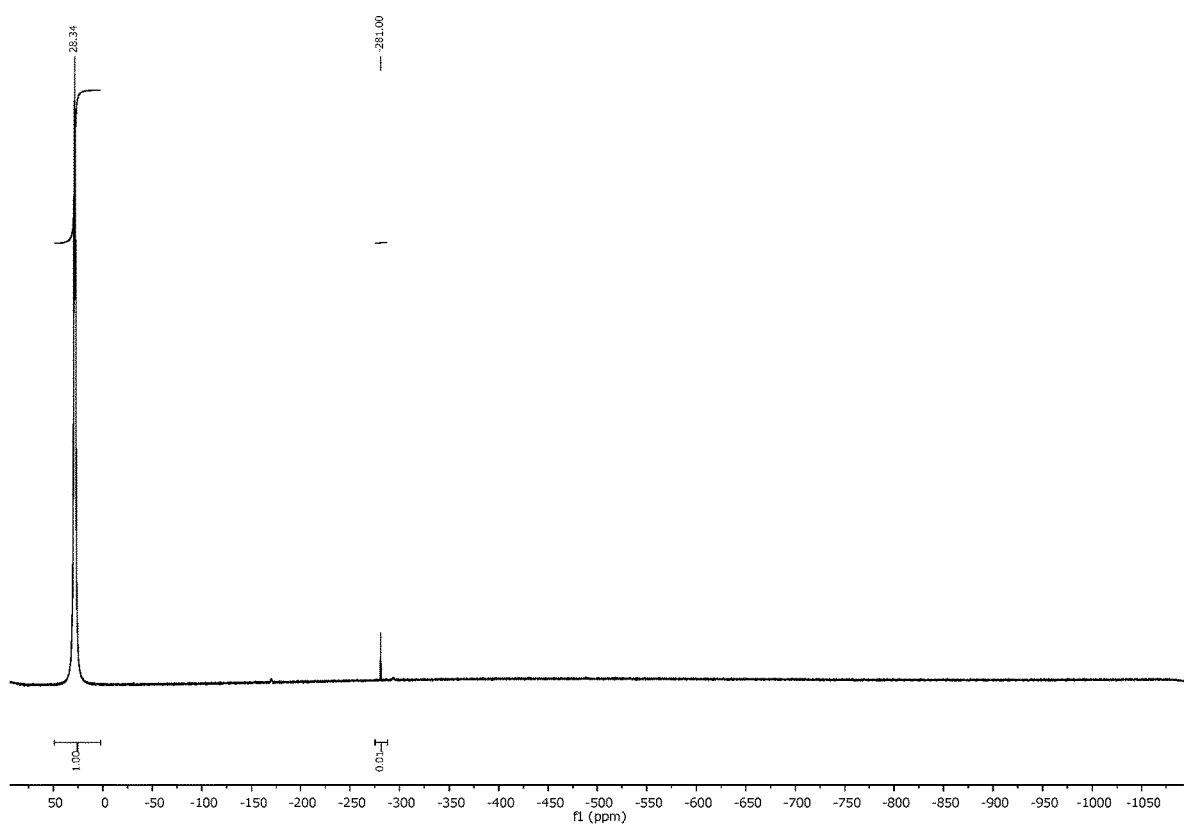
FIG. 10 is an illustration of the 51V NMR of Trichloro (sec-Butylimino)Vanadium(V) in Toluene-$C_7D_8$

The crude material was transferred to a sublimer and evacuated under dynamic vacuum at room temperature for 2 h to remove any remaining VOCl$_3$. Then cooling water was turned on and heating temperature was raised to 40° C. to afford ~480 mg dark green solid. $^1$H NMR (400 MHz, D8 toluene) δ=3.65 (b, 1H), δ=1.50 (m, 1H), δ=1.06 (m, 1H), δ=0.93 (d, 3H), δ=0.77 (t, 3H), was shown in FIG. 9. 51V NMR (400 MHz) δ=−28.3, was shown in FIG. 10.

Figure 11:
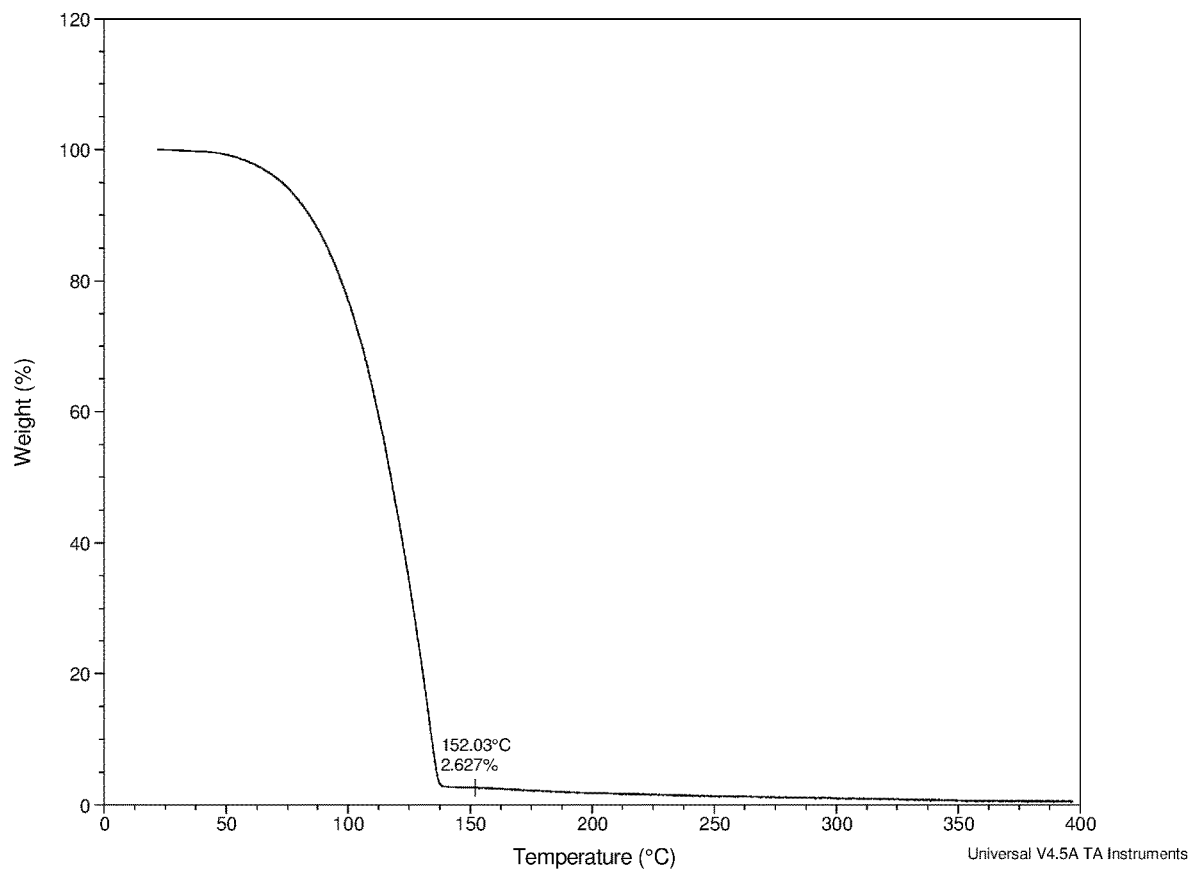
FIG. 11 is an illustration of the thermogravimetric analysis (TGA) of Trichloro(sec-Butylimino)Vanadium(V)
Figure 12:
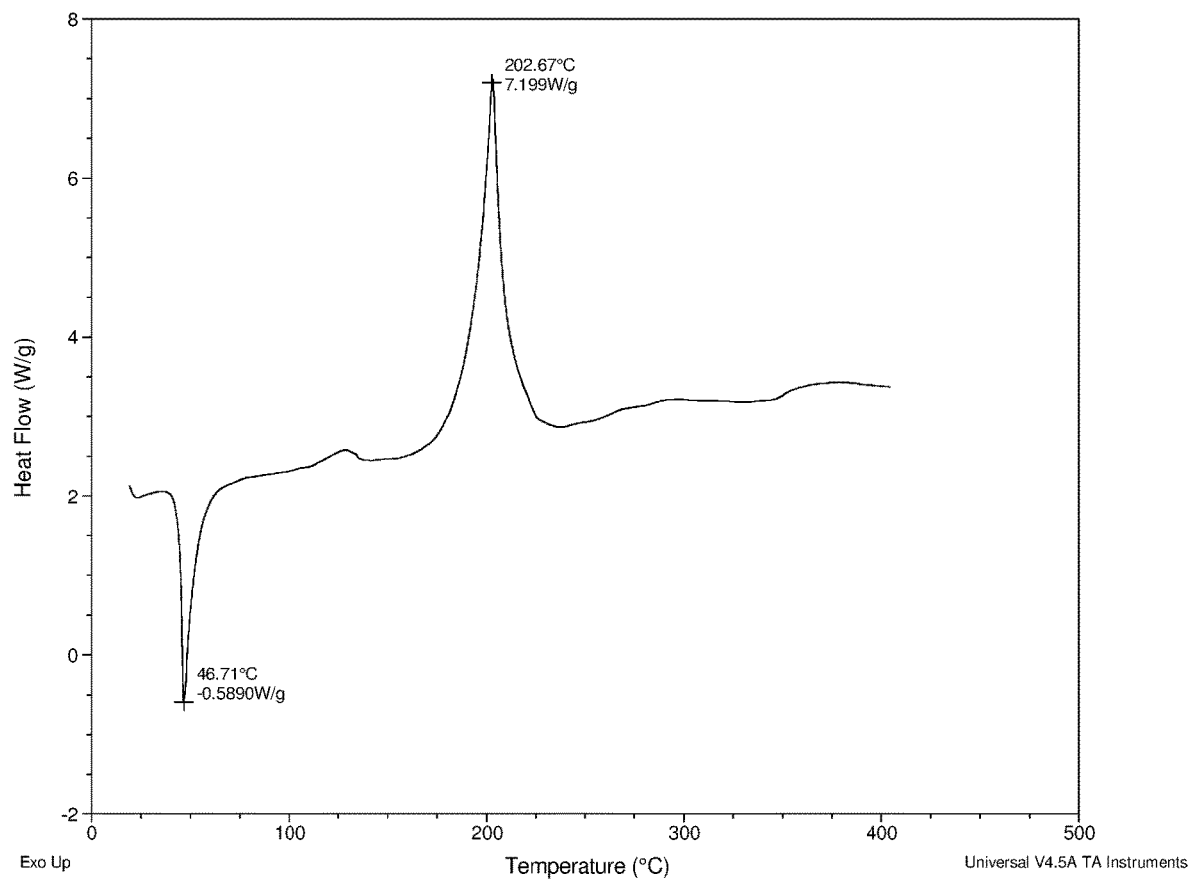
FIG. 12 is an illustration of the differential scanning calorimetry (DSC) of Trichloro(sec-Butylimino)Vanadium (V), demonstrating trichloro(sec-Butylimino)Vanadium(V) starts to decompose around 203° C.

The compound was also characterized by thermogravimetric analysis (TGA) as shown in FIG. 11, and differential scanning calorimetry (DSC), as shown in FIG. 12. Comparing listed examples 1 and 3, we can see for structure C, the compound thermal stability is much better for R$^1$ is tert-amyl than for R$^1$ is sec-butyl as shown by differential scanning calorimetry DSC in FIG. 4 vs. FIG. 12.

Example 4

Figure 13:
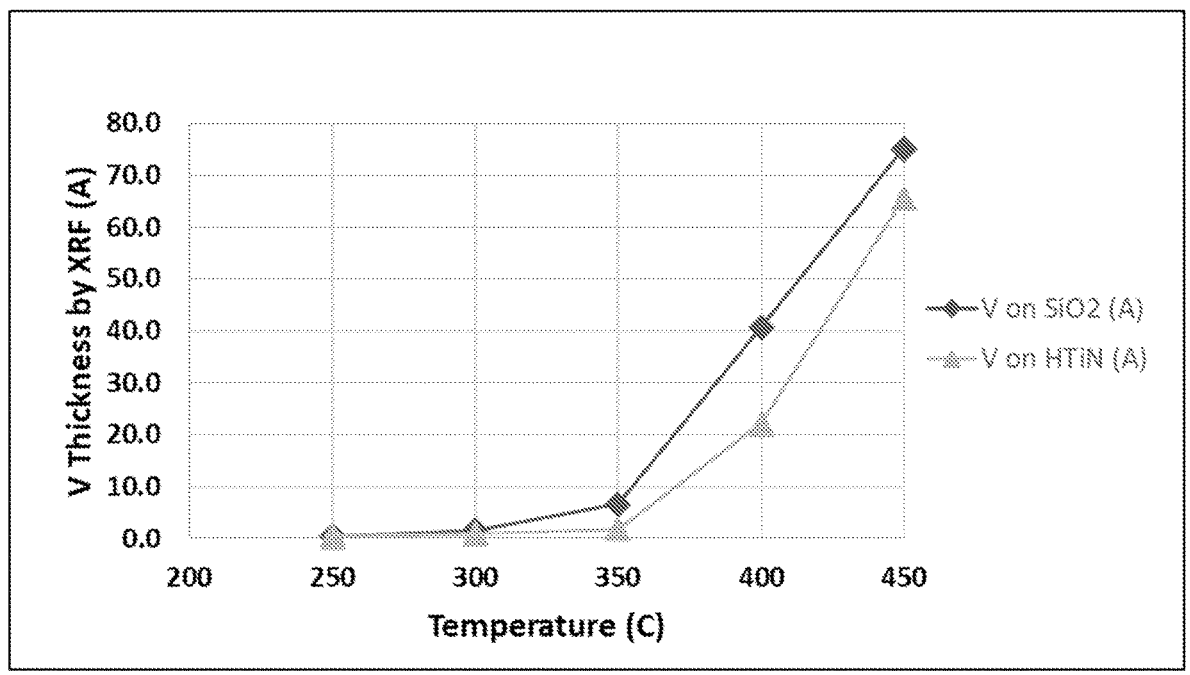
FIG. 13 is an illustration of the Thermal Decomposition curve of Trichloro(tert-Amylimino)Vanadium(V) on the substrates

Deposition of Vanadium Nitride Films Using Trichloro(tert-amylimino)vanadium(V) as Precursor by Thermal Process In the deposition process, trichloro(tert-amylimino)vanadium(V) was delivered to the reactor chamber by passing 20 sccm argon through stainless steel containers filled with trichloro(tert-amylimino)vanadium(V). Container temperature at 60° C. to achieve sufficient vapor pressure of the trichloro(tert-amylimino)vanadium(V) precursor, and to melt this precursor to allow delivery from the liquid phase. Pulse of 5 sec trichloro(tert-amylimino)vanadium(V) was followed by 20 sec of Ar purge for 100 cycles. The substrate temperature varied between from 250° C. and 450° C., pressure at 2 torr. The substrates were TiN and SiO$_2$. Thermal Decomposition curve in FIG. 13 shows the CVD onset at 350° C.

Figure 14:
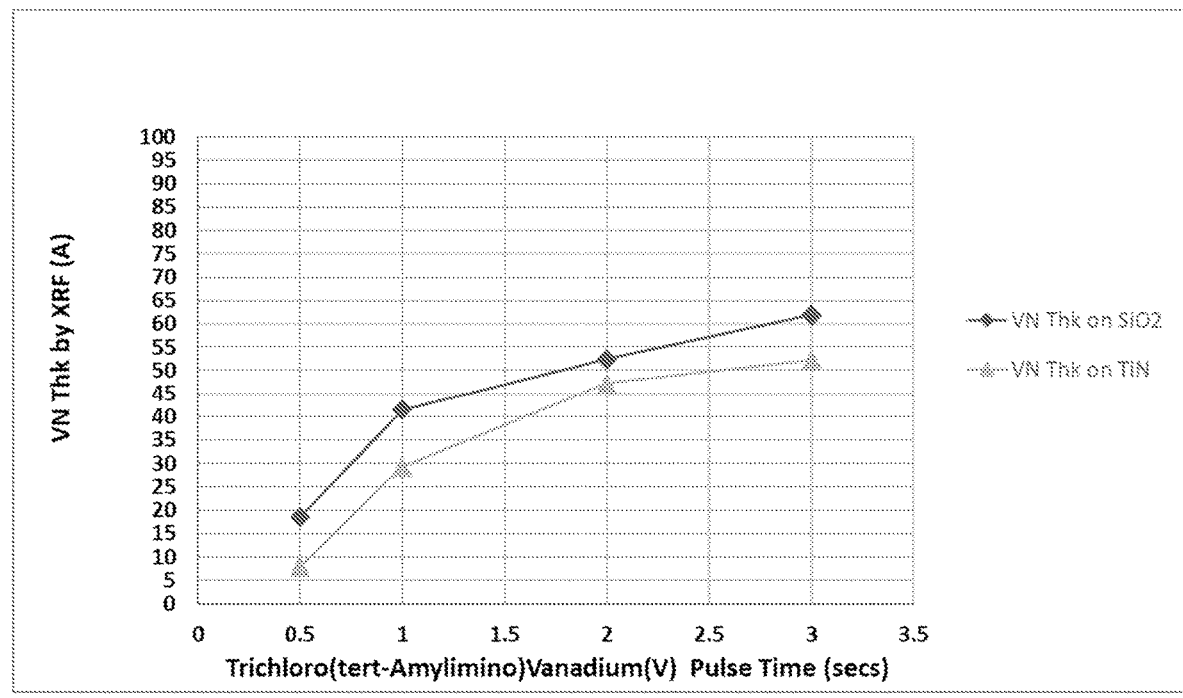
FIG. 14 is an illustration of the Vanadium Nitride film deposition by Trichloro(tert-Amylimino)Vanadium(V) and Ammonia.

The vanadium nitride film was then deposited by pulsed flow of trichloro(tert-amylimino)vanadium(V) to the reactor chamber by passing 20 sccm argon bubbler flow, and pulse ammonia flow at 300 sccm. Pulses of V precursor, argon (20 sccm), Ammonia (300 sccm), and argon (20 sccm) were 0.5-3 seconds, 30 seconds, 5 seconds, and 30 seconds, respectively. Substrate temperature was set at 300° C. and pressure at 2 Torr. Saturation was observed at 2 second trichloro(tert-amylimino)vanadium(V) pulse, as shown in FIG. 14.

Figure 15:
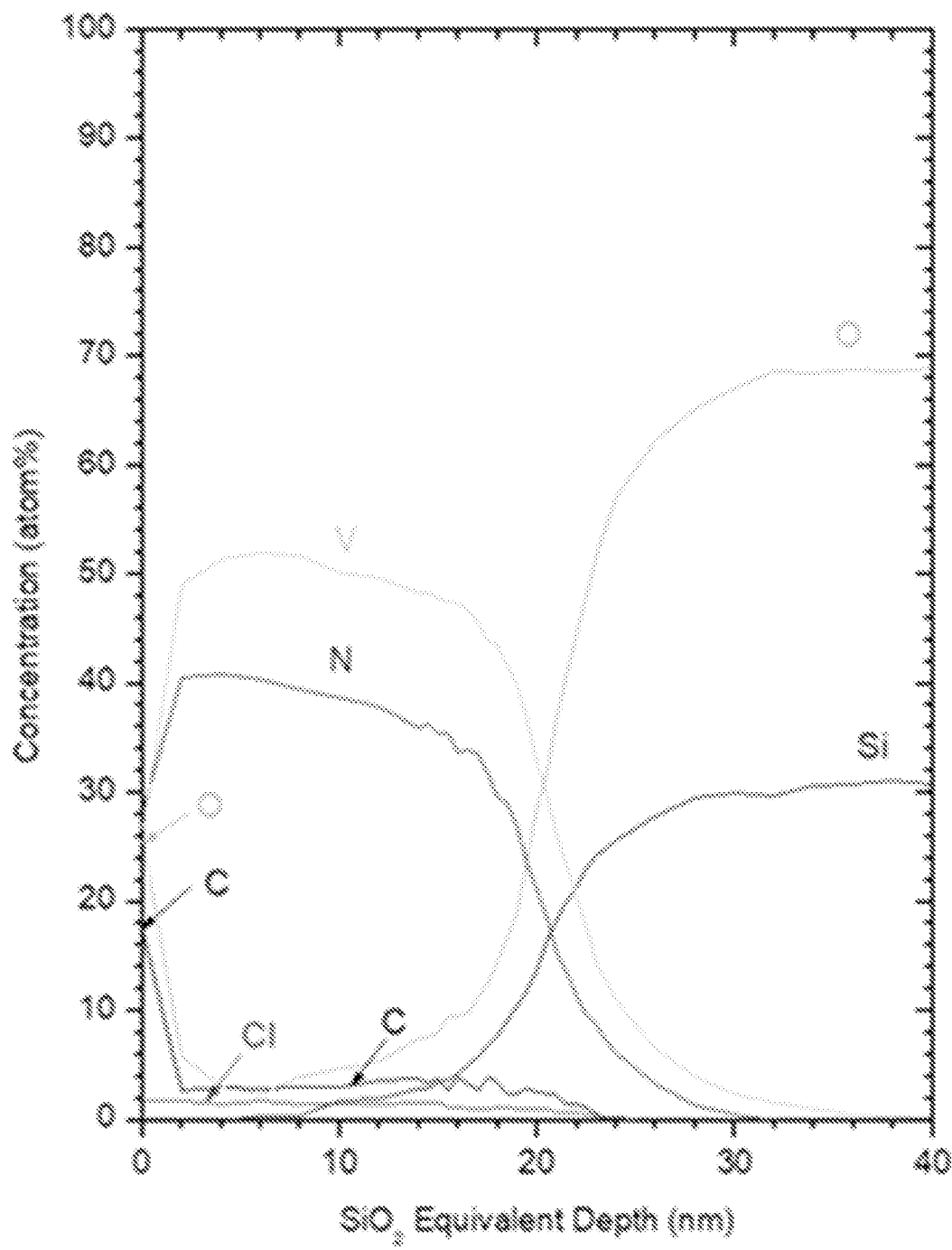
FIG. 15 is an illustration of the X-ray Photoelectron Spectroscopy (XPS) characterization of Vanadium Nitride film deposition by Trichloro(tert-Amylimino)Vanadium(V) and Ammonia.

The vanadium nitride film deposited from trichloro(tert-amylimino)vanadium(V) and ammonia at 300° C. was analyzed by x-ray photoelectron spectroscopy (XPS), as shown in FIG. 15, to determine elemental concentration throughout the film as below. The results are: C (3.1 at. %), N (40 at. %), 0 (4 at. %), Si (0.3 at. %), Cl (0.5 at. %), V (52 at. %), V:N=1.31.

Figure 16:
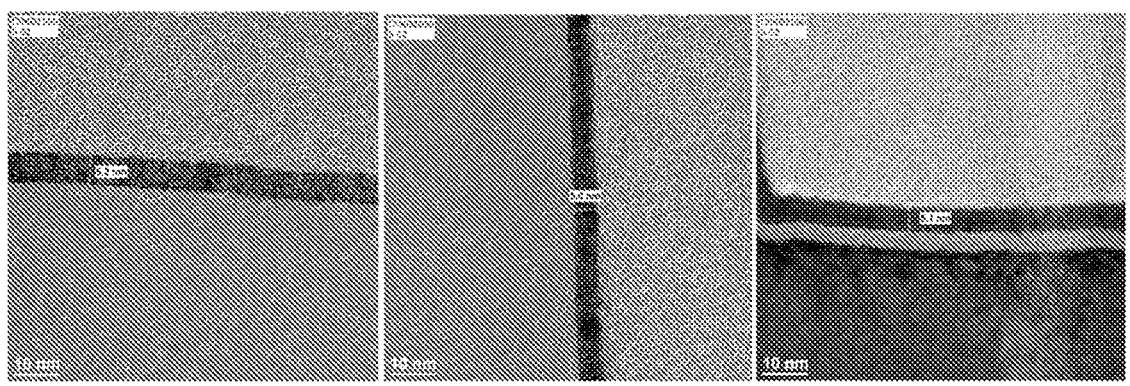
FIG. 16 is an illustration of the Transmission electron microscopy (TEM) images of the Vanadium Nitride Film on feature of 16:1 aspect.

Transmission electron microscopy (TEM) was used to study the step coverage of the vanadium nitride film deposited on feature of 16:1 aspect ratio as shown in FIG. 16. The step coverage is defined as the ratio (in %):thickness at the bottom of the feature is divided by thickness at the top of the feature, the middle step coverage being the ratio (in %):thickness on a sidewall of the feature is divided by thickness at the top of the feature. It was found that 79% step coverage in the middle and 79% step coverage at the bottom.

Example 5

Deposition of Vanadium Nitride Films Using Trichloro(tert-amylimino)vanadium(V) as Precursor by Plasma-Assisted Process The purpose of this experiment was to demonstrate that introducing plasma pulse to the process sequence can reduce resistivity of vanadium nitride films. The vanadium Nitride film was deposited by pulsed flow of trichloro(tert-amylimino)vanadium(V) to the reactor chamber by passing 20 sccm argon bubbler flow, and pulsed ammonia flow at 300 sccm. Plasma pulse was added after ammonia pulse and argon purge. The total pulse sequence was:
1) Trichloro(tert-amylimino)vanadium(V), 2 sec
2) Argon purge, 30 sec
3) Ammonia pulse, 5 sec
4) Argon purge, 30 sec
5) Either H2, N2 or NH3 plasma pulse, 5 sec
6) Argon purge, 10 sec The number of pulses was 125 in each experiment. The vanadium nitride film thickness was measured by X-ray fluorescence (XRF). Film resistivity was measured by four-point probe electrode. The comparison of vanadium nitride film resistivity from plasma-assisted process to vanadium nitride films deposited by thermal process in example 4 is provided in Table 1.

TABLE 1

Resistivity of Vanadium Nitride Films

| Wafer Temperature, Degree ° C. | Plasma Reagent | Film Thickness, Å | Film Resistivity, μOhm-cm |
| --- | --- | --- | --- |
| 300 | Not used | 66 | 515 |
| 300 | $N_2$ | 45 | 392 |
| 300 | $H_2$ | 102 | 131 |
| 350 | Not used | 106 | 295 |
| 350 | $N_2$ | 74 | 200 |
| 350 | $H_2$ | 93 | 132 |
| 350 | $NH_3$ | 68 | 165 |

This experiment demonstrated that introducing hydrogen plasma pulse significantly reduced resistivity of vanadium nitride films below 140 μOhm-cm.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A precursor having a chemical structure selected from the group consisting of:

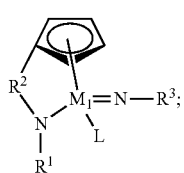

A

B

C

D

E

F

G wherein:
$M_1$ is selected from the group consisting of vanadium, tantalum, niobium, chromium, molybdenum and tungsten;
X is a halide selected from chloride (Cl), bromide (Br) and iodide (I);
$R^1$ is a linear or branched $C_1$-C10 alkyl, an amino group or an ether group for A and B, and is a linear or branched $C_1$-$C_{10}$ alkyl, an amino group or an ether group but not tert-butyl for C and G;
$R^2$ is a linear or branched $C_2$-$C_{10}$ alkylene;
$R^3$, $R^4$ and $R^6$ are independently selected from the group consisting of a linear or branched $C_1$-$C^{10}$ alkyl, an amino group and an ether group;
$R^5$ is selected from the group consisting of hydrogen and a linear or branched $C_1$-$C_{10}$ alkyl;
L is selected from the group consisting of $R^1$, $OR^1$ and $NR^1R^3$;
$L_1$ is a substituted or unsubstituted cyclopentadienyl ligand;
$L_2$ is $NR^1R^3$;
m has a value of 0, 1 or 2, and
n has a value of 1, 2, 3 or 4.

2. The precursor of claim 1, wherein the precursor has the structure B; wherein $M_1$ is vanadium; $R^2$ is a linear $C_2$ alkylene; $R^1$ and $R^3$ are methyl; $R^5$ is hydrogen and $R^4$ and $R^6$ are selected from the same linear $C_1$ to $C_2$ alkyl.

3. The precursor of claim 1, wherein the precursor has the structure C; wherein: $M_1$ is vanadium; and $R_1$ is selected from the group consisting of sec-butyl ($Bu^s$) and tert-amyl ($Amyl^t$).

4. The precursor of claim 1, wherein the precursor has structure C and is selected from the group consisting of:

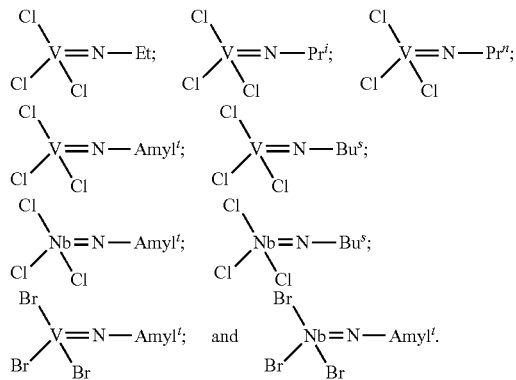

5. The precursor of claim 1, wherein the precursor has the structure D; wherein: $M_1$ is vanadium; $R^2$ is a linear or branched $C_2$ to $C_3$ alkylene and $R^3$ is a linear $C_1$ to $C_2$ alkyl.

6. The precursor of claim 1, wherein the precursor has the structure E; wherein: $M_1$ is vanadium; and $R^1$ and $R^3$ are selected from the same linear or branched chin $C_1$ to $C_3$ alkyl.

7. The precursor of claim 1, wherein the precursor has the structure F; wherein m has a value of zero, n has a value of 3 and $R^1$ and $R^3$ are independently selected from the group consisting of methyl and ethyl groups.

8. The precursor of claim 1, wherein the precursor has the structure F; wherein m has a value of 1, n has a value of 2 and $R^1$ and $R^3$ are independently selected from the group consisting of methyl and ethyl groups.

9. The precursor of claim 1, wherein the precursor has the structure G and is selected from the group consisting of:

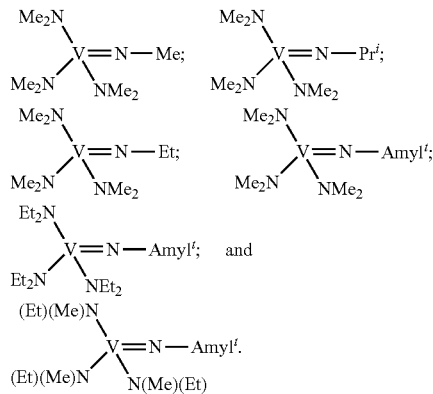

10. The precursor of claim 1, wherein the precursor is selected from the group consisting of trichloro(tert-amylimino)vanadium; trichloro(sec-butylimino)vanadium; and tert-amylimino-tris(dimethylamino)vanadium.

11. The precursor of claim 1, wherein at least one cyclopentadienyl ligand is bound to a transition metal in $\eta^5$-coordination by π bonding.

12. The precursor of claim 1, wherein the precursor is substantially free of halide ions, metal impurities, or both of halide ions and metal impurities.

13. The precursor of claim 1, wherein the precursor has a melting point of 120 degrees Celsius or less, 70 degrees Celsius or less, 60 degrees Celsius or less, 50 degrees Celsius or less, 40 degrees Celsius or less, or 30 degrees Celsius or less.

14. The precursor of claim 1, wherein the precursor is in a liquid form at ambient temperature.

15. The precursor of claim 1, wherein the precursor has chemical structure selected from the group consisting of B, C, D, E, F, and G.

16. A composition comprising the precursor of claim 1 and a solvent therefor.

17. The composition of claim 16, wherein the solvent is a hydrocarbon solvent selected from the group consisting of an ether, a tertiary amine, an alkyl hydrocarbon, an aromatic hydrocarbon, a siloxane, a tertiary aminoether, and combinations thereof.

18. The composition of claim 16, wherein the organometallic compound and the hydrocarbon solvent each comprise a boiling point, wherein a difference between the boiling point of the organometallic compound and the boiling point of the solvent is less than 40 degrees Celsius; 30 degrees Celsius; 20 degrees Celsius; or 10 degrees Celsius.

19. The composition of claim 16, wherein the composition has a melting point of 120 degrees Celsius or less, 70 degrees Celsius or less, 60 degrees Celsius or less, 50 degrees Celsius or less, 40 degrees Celsius or less, or 30 degrees Celsius or less.

20. The composition of claim 16, wherein the composition is in a liquid form at ambient temperature.

21. The composition of claim 16, further comprising a melting point depression additive comprising a low volatility inert substance selected from the group consisting of a long chain, branched or cyclic saturated hydrocarbon $C_nH_{n+2}$, wherein n has a value of 10 to about 20; a substituted arene; an organoamine; an aminoether; an ether; and combinations thereof.

22. A method for forming a transition metal-containing film on at least one surface of a substrate comprising:
  a. providing the at least one surface of the substrate in a reaction chamber;
  b. forming a transition metal-containing film on the at least one surface by a deposition process chosen from a chemical vapor deposition process and an atomic layer deposition process using the precursor of claim 1 or the composition of claim 16 as a metal source compound for the deposition process.

23. The method of claim 22, wherein the precursor of claim 1 or the precursor of the composition of claim 16 in step b is selected from the group consisting of

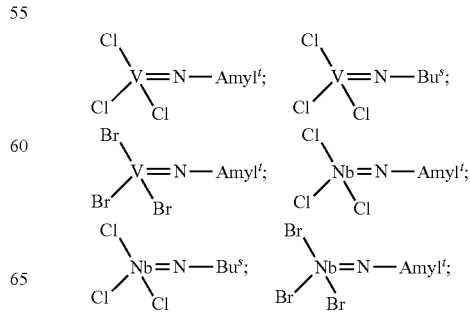

-continued

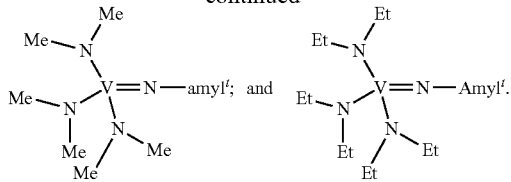

24. The method of claim 22, wherein the precursor of claim 1 or the precursor in the composition of claim 16 is in a liquid form at ambient temperature; and has a melting point of 120 degrees Celsius or less, 70 degrees Celsius or less, 60 degrees Celsius or less, 50 degrees Celsius or less, 40 degrees Celsius or less, or 30 degrees Celsius or less.

25. The method of claim 22, wherein the precursor of claim 1 or the precursor in the composition of claim 16 in step b is selected from the group consisting of trichloro(tert-amylimino)Vanadium, trichloro(sec-butylimino)vanadium, and tert-amylimino-tris(dimethylamino)vanadium; and the transition metal-containing film is vanadium-containing film.

26. The method of claim 22, further comprising introducing into the reaction chamber at least one oxygen-containing source selected from the group consisting of water, diatomic oxygen, hydrogen peroxide, oxygen plasma, ozone, NO, $N_2O$, $NO_2$, carbon monoxide, carbon dioxide and combinations thereof.

27. The method of claim 22, further comprising introducing into the reaction chamber at least one nitrogen-containing source selected from the group consisting of ammonia, hydrazine, monoalkylhydrazine, dialkylhydrazine, nitrogen, nitrogen/hydrogen, ammonia plasma, nitrogen plasma, nitrogen/hydrogen plasma, and combinations thereof.

28. The method of claim 22, further comprising introducing into the reaction chamber at least one reducing agent source selected from the group consisting of hydrogen, hydrogen plasma, a mixture of hydrogen and helium, a mixture of hydrogen and argon, hydrogen/helium plasma, hydrogen/argon plasma, boron-containing compounds, silicon-containing compounds and combinations thereof.

29. The method of claim 22, further comprising introducing into the reaction chamber at least one purge gas selected from the group consisting of argon (Ar), nitrogen ($N_2$), helium (He), neon, and combinations thereof.

30. The method of claim 27, wherein the precursor of claim 1 or the precursor in the composition of claim 16 in step b is selected from the group consisting of trichloro(tert-amylimino)Vanadium, trichloro(sec-butylimino)vanadium, and tert-amylimino-tris(dimethylamino)vanadium; the nitrogen-containing source is ammonia; and the transition metal-containing film is vanadium nitride film.

31. The method of claim 22, wherein the solvent in the composition of claim 16 is selected from the group consisting of: toluene, mesitylene, isopropylbenzene, 4-isopropyl toluene, 1,3-diisopropylbenzene, octane, dodecane, 1,2,4-trimethylcyclohexane, n-butylcyclohexane, and decahydronaphthalene and combinations thereof.

32. The method of claim 22, wherein step b comprises introducing into the reaction chamber the precursor of claim 1 or the precursor in the composition of claim 16 selected from the group consisting of:

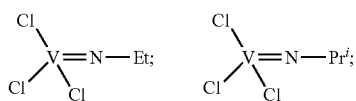

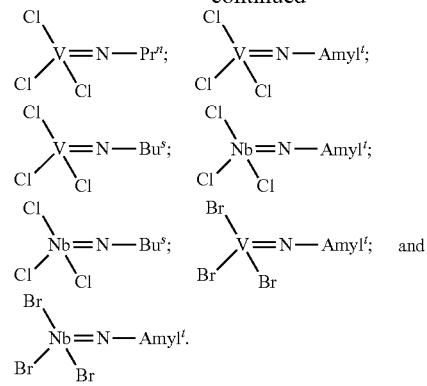

33. The method of claim 32, wherein the precursor of claim 1 or the precursor in the composition of claim 16 is in a liquid form at ambient temperature and has a melting point of 120 degrees Celsius or less, 70 degrees Celsius or less, 60 degrees Celsius or less, 50 degrees Celsius or less, 40 degrees Celsius or less, or 30 degrees Celsius or less.

34. The method of claim 22, wherein step b comprises introducing into the reaction chamber the precursor of claim 1 or the precursor in the composition of claim 16 selected from the group consisting of:

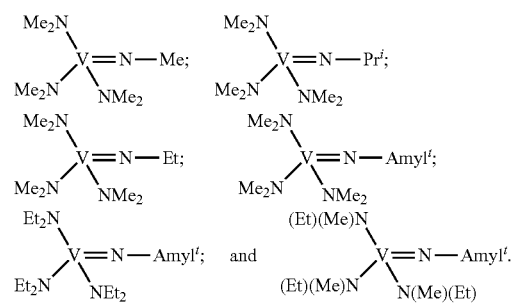

35. The method of claim 34, wherein the precursor of claim 1 or the precursor in the composition of claim 16 is in a liquid form at ambient temperature and has a melting point of 120 degrees Celsius or less, 70 degrees Celsius or less, 60 degrees Celsius or less, 50 degrees Celsius or less, 40 degrees Celsius or less, or 30 degrees Celsius or less.

36. A method of forming a transition metal-containing film via an atomic layer deposition process or ALD-like process, the method comprising the steps of:
 a. providing a substrate in a reaction chamber,
 b. introducing into the reaction chamber the precursor of claim 1 or the composition of claim 16;
 c. purging the reaction chamber with a first purge gas,
 d. introducing into the reaction chamber a source gas,
 e. purging the reaction chamber with a second purge gas,
 f. performing the step b after the step a,
 g. performing the step c after the step b,
 h. performing the step d after the step c,
 i. performing the step 6 after the step d,
 j. repeating the steps b through e until a desired thickness of the transition metal-containing film is obtained.

37. The method of claim 36, wherein the precursor of claim 1 or the precursor in the composition of claim 16 in step b is selected from the group consisting of

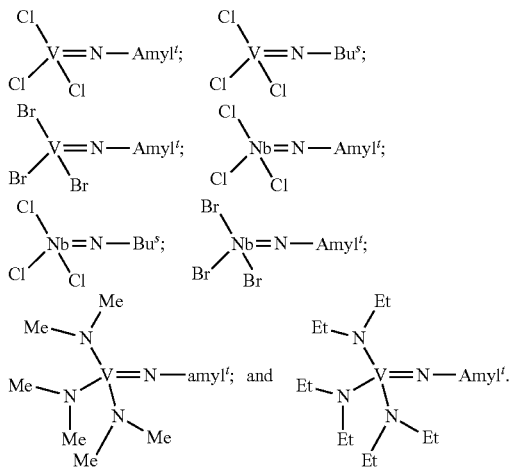

38. The method of claim 36, wherein the precursor of claim 1 or the precursor in the composition of claim 16 in step b is selected from the group consisting of trichloro(tert-amylimino)Vanadium, trichloro(sec-butylimino)vanadium, and tert-amylimino-tris(dimethylamino)vanadium; and the transition metal-containing film is vanadium-containing film.

39. The method of claim 36, wherein the source gas is selected from the group consisting of: an oxygen-containing source gas selected from water, diatomic oxygen, hydrogen peroxide, oxygen plasma, ozone, NO, $N_2O$, $NO_2$, carbon monoxide, carbon dioxide, and combinations thereof.

40. The method of claim 36, wherein the source gas is selected from the group consisting of: a nitrogen-containing source gas selected from ammonia, hydrazine, monoalkyl-hydrazine, dialkylhydrazine, nitrogen, nitrogen/hydrogen, ammonia plasma, nitrogen plasma, nitrogen/hydrogen plasma, and combinations thereof.

41. The method of claim 40, wherein the precursor of claim 1 or the precursor in the composition of claim 16 in step b is selected from the group consisting of trichloro(tert-amylimino)Vanadium, trichloro(sec-butylimino)vanadium, and tert-amylimino-tris(dimethylamino)vanadium; the nitrogen-containing source is ammonia; and the transition metal-containing film is vanadium nitride film.

42. The method of claim 36, wherein the first and second purge gases are selected from the group consisting of: argon, nitrogen, helium, neon, and combinations thereof.

43. The method of claim 36, further comprising applying energy to at least one of the precursor, the source gas, the substrate, and combinations thereof; wherein the energy is selected from the group consisting of thermal, plasma, pulsed plasma, helicon plasma, high density plasma, inductively coupled plasma, X-ray, e-beam, photon, remote plasma, and combinations thereof.

44. The method of claim 36, wherein the step b further comprises introducing into the reaction chamber the precursor of claim 1 or the composition of claim 16 using a stream of carrier gas to deliver a vapor of the precursor into the reaction chamber.

45. The method of claim 36, wherein the precursor of claim 1 or the precursor in the composition of claim 16 is in a liquid form at ambient temperature and has a melting point of 120 degrees Celsius or less, 70 degrees Celsius or less, 60 degrees Celsius or less, 50 degrees Celsius or less, 40 degrees Celsius or less, or 30 degrees Celsius or less.

46. The method of claim 36, wherein step b comprises introducing into the reaction chamber the precursor of claim 1 or the precursor in the composition of claim 16 selected from the group consisting of:

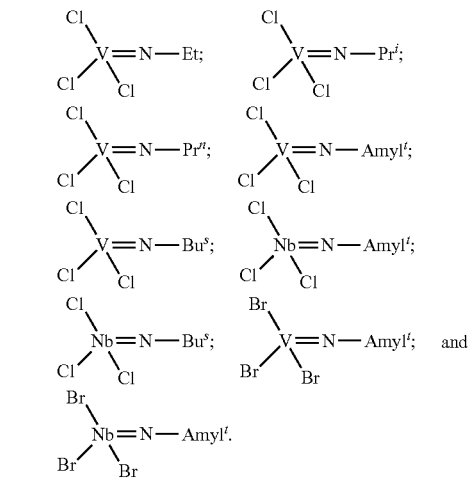

47. The method of claim 46, wherein the precursor of claim 1 or the precursor in the composition of claim 16 is in a liquid form at ambient temperature; and has a melting point of 120 degrees Celsius or less, 70 degrees Celsius or less, 60 degrees Celsius or less, 50 degrees Celsius or less, 40 degrees Celsius or less, or 30 degrees Celsius or less.

48. The method of claim 36, wherein step b comprises introducing into the reaction chamber the precursor of claim 1 or the precursor in the composition of claim 16 selected from the group consisting of:

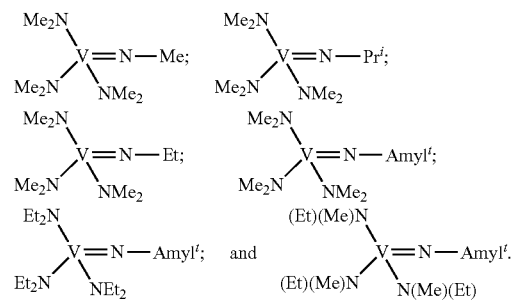

49. The method of claim 48, wherein the precursor of claim 1 or the precursor in the composition of claim 16 is in a liquid form at ambient temperature and has a melting point of 120 degrees Celsius or less, 70 degrees Celsius or less, 60 degrees Celsius or less, 50 degrees Celsius or less, 40 degrees Celsius or less, or 30 degrees Celsius or less.

50. The method of claim 36, wherein the solvent in the composition of claim 16 is selected from the group consisting of: toluene, mesitylene, isopropylbenzene, 4-isopropyl toluene, 1,3-diisopropylbenzene, octane, dodecane, 1,2,4-trimethylcyclohexane, n-butylcyclohexane, and decahydronaphthalene and combinations thereof.

51. A precursor supply package, comprising a vessel and (i) a precursor having a chemical structure selected from the group consisting of:

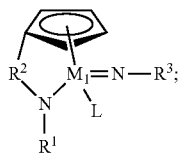

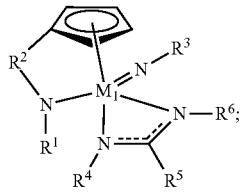

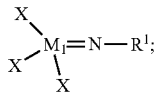

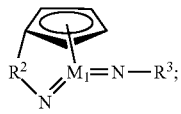

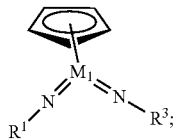

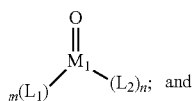

-continued wherein:

$M_1$ is selected from the group consisting of vanadium, tantalum, niobium, chromium, molybdenum and tungsten;

X is a halide selected from chloride (Cl), bromide (Br) and iodide (I);

$R^1$ is a linear or branched $C_1$-$C_{10}$ alkyl, an amino group or an ether group for A and B; and is a linear or branched $C_1$-$C_{10}$ alkyl, an amino group or an ether group but not tert-butyl for C and G;

$R^2$ is a linear or branched $C_2$-$C_{10}$ alkylene;

$R^3$, $R^4$ and $R^6$ are independently selected from the group consisting of a linear or branched $C_1$-$C_{10}$ alkyl, an amino group and an ether group;

$R^5$ is selected from the group consisting of hydrogen and a linear or branched $C_1$-$C_{10}$ alkyl;

L is selected from the group consisting of $R^1$, $OR^1$ and $NR^1R^3$;

$L_1$ is a substituted or unsubstituted cyclopentadienyl ligand;

$L_2$ is $NR^1R^3$;

m has a value of 0, 1 or 2; and n has a value of 1, 2, 3 or 4, or (ii) a composition thereof, wherein the vessel is adapted to contain and dispense the precursor or composition thereof.

52. The precursor supply package of claim 51, wherein the precursor has a melting point of 120 degrees Celsius or less, 70 degrees Celsius or less, 60 degrees Celsius or less, 50 degrees Celsius or less, 40 degrees Celsius or less, or 30 degrees Celsius or less.

53. The precursor supply package of claim 51, wherein the precursor is in liquid form under delivery conditions.

* * * * *